US012592678B2

(12) United States Patent
Liu et al.

(10) Patent No.: US 12,592,678 B2
(45) Date of Patent: Mar. 31, 2026

(54) ACOUSTIC WAVE DEVICE WITH TRANSVERSE SPURIOUS MODE SUPPRESSION

(71) Applicant: Skyworks Solutions, Inc., Irvine, CA (US)

(72) Inventors: Yuhao Liu, Los Angeles, CA (US); Jiansong Liu, Fremont, CA (US); Chun Sing Lam, San Jose, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 18/642,391

(22) Filed: Apr. 22, 2024

(65) Prior Publication Data

US 2024/0348231 A1    Oct. 17, 2024

Related U.S. Application Data

(63) Continuation of application No. 17/449,148, filed on Sep. 28, 2021, now Pat. No. 11,990,892, which is a continuation of application No. 16/700,947, filed on Dec. 2, 2019, now Pat. No. 11,165,411.

(60) Provisional application No. 62/774,734, filed on Dec. 3, 2018, provisional application No. 62/774,762, filed on Dec. 3, 2018.

(51) Int. Cl.
| | |
|---|---|
| *H03H 9/54* | (2006.01) |
| *H03H 9/02* | (2006.01) |
| *H03H 9/64* | (2006.01) |
| *H03H 9/72* | (2006.01) |

(52) U.S. Cl.
CPC .......... *H03H 9/54* (2013.01); *H03H 9/02834* (2013.01); *H03H 9/02992* (2013.01); *H03H 9/64* (2013.01); *H03H 9/725* (2013.01)

(58) Field of Classification Search
CPC .. H03H 9/54; H03H 9/02834; H03H 9/02992; H03H 9/64; H03H 9/725
See application file for complete search history.

(56) References Cited

U.S. PATENT DOCUMENTS

| | | | |
|---|---|---|---|
| 4,477,784 | A | 10/1984 | Maerfeld et al. |
| 7,482,896 | B2 | 1/2009 | Wada et al. |
| 7,576,471 | B1 | 8/2009 | Solal |
| 9,319,023 | B2 | 4/2016 | Tanaka |
| (Continued) | | | |

FOREIGN PATENT DOCUMENTS

| | | |
|---|---|---|
| JP | 2002-084162 | 3/2002 |
| JP | 2010-098506 | 4/2010 |

OTHER PUBLICATIONS

M. Solal et al., "Transverse modes suppression and loss reduction for buried electrodes SAW devices," 2010 IEEE International Ultrasonics Symposium, San Diego, CA, 2010, pp. 624-628.

(Continued)

*Primary Examiner* — Samuel S Outten
(74) *Attorney, Agent, or Firm* — Knobbe, Martens, Olson & Bear, LLP

(57) ABSTRACT

An acoustic wave device with a bent section is disclosed. The acoustic wave device includes a piezoelectric layer and an interdigital transducer electrode on the piezoelectric layer. The bent section is arranged to create a curvature in a waveguide of the acoustic wave device to suppress a transverse spurious mode of the acoustic wave device.

19 Claims, 20 Drawing Sheets

(56)                    References Cited

U.S. PATENT DOCUMENTS

| | | |
|---|---|---|
| 9,641,152 B2 | 5/2017 | Nakamura et al. |
| 11,165,411 B2 | 11/2021 | Liu et al. |
| 11,990,892 B2 | 5/2024 | Liu et al. |
| 2002/0044497 A1 | 4/2002 | Kachi et al. |
| 2007/0046400 A1* | 3/2007 | Wada ................. H03H 9/14532 |
| | | 333/196 |
| 2012/0161577 A1 | 6/2012 | Abbott et al. |
| 2016/0056791 A1 | 2/2016 | Shimizu et al. |
| 2016/0149553 A1 | 5/2016 | Yoon et al. |
| 2016/0294361 A1 | 10/2016 | Yamane et al. |
| 2017/0093367 A1 | 3/2017 | Mimura |
| 2017/0279433 A1 | 9/2017 | Matsukura et al. |
| 2017/0366157 A1 | 12/2017 | Liu et al. |
| 2018/0097508 A1 | 4/2018 | Iwamoto et al. |
| 2018/0219528 A1 | 8/2018 | Liu et al. |
| 2020/0127638 A1 | 4/2020 | Daimon |
| 2020/0177159 A1 | 6/2020 | Liu et al. |
| 2022/0014177 A1 | 1/2022 | Liu et al. |

OTHER PUBLICATIONS

P. V. Wright, "A review of SAW resonator filter technology," IEEE 1992 Ultrasonics Symposium Proceedings, Tucson, AZ, 1992, pp. 29-38 vol. 1.

S. A. Wilkus, et al., "Transverse Mode Compensation of Surface Acoustic Wave Filters," IEEE 1985 Ultrasonics Symposium, San Francisco, Ca, USA, 1985, pp. 43-47.

R. Ruby, "Review and Comparison of Bulk Acoustic Wave FBAR, SMR Technology," in IEEE International Ultrasonics Symposium Proceedings, New York, NY, 2007, pp. 1029-1040.

C. S. Lam, "A Review of the Timing and Filtering Technologies in Smartphones," in IEEE International Frequency Control Symposium Proceedings, New Orleans, LA, 2016, pp. 1-6.

H. Iwamoto, T. Takai, Y. Takamine, T. Nakao, T. Fuyutsume and M Koshino, "Transverse Modes in I.H.P. SAW Resonator and Their Suppression Method," in IEEE International Ultrasonics Symposium Proceedings, Kobe, 2018.

H. Nakamura, H. Nakanishi, R. Goto and K. Hashimoto, "Suppression of Transverse Mode Spurious Responses for SAW Resonators on SiO2/Al/LiNbO3 Structure by Selective Removal of SiO2," in IEEE Transactions on Ultrasonics, Ferroelectrics, and Frequency Control, vol. 58, No. 10, pp. 2188-2193, Oct. 2011.

H. Nakamura et al., "Suppression of Transverse Mode Spurious in SAW Resonators on an SiO2/Al/LiNbO3 Structure for Wideband CDMA Applications," in IEEE International Ultrasonics Symposium Proceedings, Beijing, 2008, pp. 594-597.

M. Giovannini et al., "Apodization technique for spurious mode suppression in AlN contour-mode resonators," in Sensors and Actuators A: Physical pp. 42-50, 2014.

Jie Zou, Jiansong Liu, G. Tang, C. Lin and C. S. Lam, "Transverse Mode Suppression in the AlN Lamb Wave Resonators by "Piston Mode"," in IEEE International Ultrasonics Symposium Proceedings, Washington, DC, 2017, pp. 1-4.

Jiansong Liu, T. Omori, Changjun Ahn and K. Hashimoto, "Impact of Surface Periodic grating on FBAR Structures to Spurious Transverse Resonances," in IEEE International Ultrasonics Symposium Proceedings, Prague, 2013, pp. 1957-1960.

Jiansong Liu, T. Omori, C. Ahn and K. Hashimoto, "Design and Simulation of Coupled-resonator Filters using Periodically Slotted Electrodes on FBARs [Correspondence]," in IEEE Transactions on Ultrasonics, Ferroelectrics, and Frequency Control, vol. 61, No. 5, pp. 881-885, May 2014.

Ken-ya, Hashimoto, Surface Acoustic Wave Devices in Telecommunications: Modelling and Simulation, Springer, 2000.

A. W. Snyder, "Generalised Fresnel's Law for Loss due to Curvature," in Electronics Letters, vol. 9, No. 26, pp. 609-610, Dec. 27, 1973.

B. Yu, Yuhao Liu, Y. Ye, J. Ren, X. Liu and Q. J. Gu, "High-Efficiency Micromachined Sub-THz Channels for Low-Cost Interconnect for Planar Integrated Circuits," in IEEE Transactions on Microwave Theory and Techniques, vol. 64, No. 1, pp. 96-105, Jan. 2016.

* cited by examiner

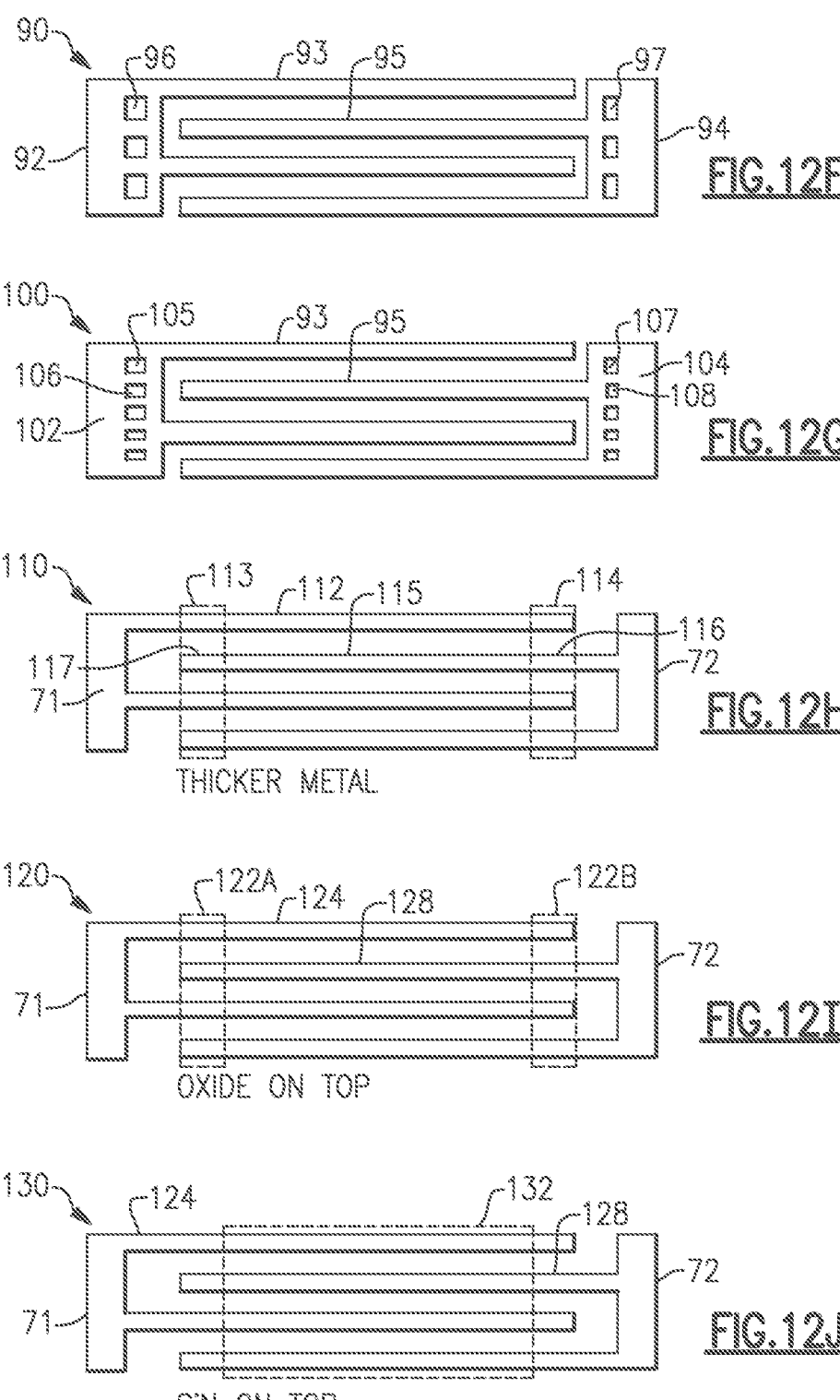
THICKER METAL
OXIDE ON TOP
SiN ON TOP

170‴

162

AlN

~165

162

170⁗

162

AlN

~165

167″

170⁗′

162′

AlN

~165

167″

ACOUSTIC WAVE DEVICE WITH TRANSVERSE SPURIOUS MODE SUPPRESSION

CROSS REFERENCE TO PRIORITY APPLICATIONS

This application is a continuation of U.S. patent application Ser. No. 17/449,148, filed Sep. 28, 2021 and titled "ACOUSTIC WAVE DEVICE WITH TRANSVERSE SPURIOUS MODE SUPPRESSION," the disclosure of which is hereby incorporated by reference in its entirety herein. U.S. patent application Ser. No. 17/449,148 is a continuation of U.S. patent application Ser. No. 16/700,947, filed Dec. 2, 2019 and titled "ACOUSTIC WAVE DEVICE WITH TRANSVERSE SPURIOUS MODE SUPPRES-SION," the disclosure of which is hereby incorporated by reference in its entirety herein. U.S. patent application Ser. No. 16/700,947 claims the benefit of priority of U.S. Provisional Patent Application No. 62/774,734, filed Dec. 3, 2018 and titled "ACOUSTIC WAVE RESONATOR WITH TRANSVERSE SPURIOUS MODE SUPPRESSION," the disclosure of which is hereby incorporated by reference in its entirety herein. U.S. patent application Ser. No. 16/700, 947 claims the benefit of priority of U.S. Provisional Patent Application No. 62/774,762, filed Dec. 3, 2018 and titled "ACOUSTIC WAVE RESONATOR WITH BENT SEC-TION," the disclosure of which is hereby incorporated by reference in its entirety herein.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed.

Certain surface acoustic wave resonators can operate with transverse spurious modes. Suppressing transverse spurious modes can be desirable.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an acoustic wave device that includes a piezoelectric layer and an interdigital transducer electrode on the piezoelectric layer. The interdigital transducer electrode includes a bent section arranged to create a curvature in a waveguide of the acoustic wave device to suppress a transverse spurious mode of the acoustic wave device.

The bent section can have a bend angle in a range from 1° to 20°. In some of these instances, the bent section can have a bend angle in a range from 10° to 20°. The acoustic wave device can further include a piston mode structure arranged to create a slow velocity boundary region of the acoustic wave device.

The acoustic wave device can include a temperature compensation layer over the interdigital transducer electrode. The acoustic wave device can be a temperature compensated surface acoustic wave resonator configure to generate a surface acoustic wave.

The interdigital transducer electrode can include a bus bar that consists essentially of an arcuate section.

The interdigital transducer electrode can include a bus bar, in which the bus bar includes an arcuate section and a straight section.

Another aspect of this disclosure is an acoustic wave device that includes a piezoelectric layer and an interdigital transducer electrode on the piezoelectric layer. The interdigital transducer electrode includes a bus bar and fingers extending from the bus bar. The bus bar includes an arcuate section. The interdigital transducer electrode is configured to suppress a transverse spurious mode of the acoustic wave device.

The arcuate section can have a bend angle in a range from 1° to 20°. The arcuate section can have a bend angle in a range from 10° to 20°.

The bus bar can consist essentially of the arcuate section. The bus bar can include a straight section.

The acoustic wave device can further include a piston mode structure arranged to create a slow velocity boundary region of the acoustic wave device.

The acoustic wave device can further include a temperature compensation layer over the interdigital transducer electrode. The acoustic wave device can further include a dispersion adjustment layer over the temperature compensation layer.

The acoustic wave device can further include a carrier substrate, in which the piezoelectric layer is over the carrier substrate. In some instances, the acoustic wave device can further include a dispersion adjustment layer positioned between the carrier substrate and the piezoelectric layer. Alternatively or additionally, the acoustic wave device can include an overlying dispersion layer positioned over the interdigital transducer electrode.

The acoustic wave device can be a surface acoustic wave resonator configure to generate a surface acoustic wave.

Another aspect of this disclosure is an acoustic wave filter that includes an acoustic wave resonator including a piezo-electric layer and an interdigital transducer electrode on the piezoelectric layer. The interdigital transducer electrode includes a bus bar and fingers extending from the bus bar. The bus bar includes an arcuate section. The acoustic wave filter also includes a plurality of additional acoustic wave resonators. The acoustic wave resonator and the additional acoustic wave resonators are together configured to filter a radio frequency signal.

The acoustic wave resonator can be a shunt acoustic wave resonator. The acoustic wave filter can be a band pass filter.

Another aspect of this disclosure is an acoustic wave device that includes a piezoelectric layer, an interdigital transducer electrode on the piezoelectric layer, and a piston mode structure arranged to create a slow velocity boundary region of the acoustic wave resonator. The interdigital transducer electrode includes a bus bar and fingers extending from the bus bar. The bus bar includes an arcuate section. The interdigital transducer electrode is configured to suppress a transverse spurious mode of the acoustic wave resonator. The slow velocity boundary region has a slower velocity than a central portion of an active region of the acoustic wave device.

The arcuate section can have a bend angle in a range from 1° to 20°. The arcuate section can have a bend angle in a range from 10° to 20°.

The bus bar can consist essentially of the arcuate section. The bus bar can include a straight section.

The acoustic wave device can further include a temperature compensation layer over the interdigital transducer electrode. In some instances, the acoustic wave device can further includes a dispersion adjustment layer over the temperature compensation layer.

The acoustic wave device can further include a carrier substrate, the piezoelectric layer being over the carrier substrate.

The acoustic wave device can further include a carrier substrate and a dispersion adjustment layer, in which the dispersion adjustment layer is positioned between the carrier substrate and the piezoelectric layer. The acoustic wave device can further include a second dispersion adjustment layer over the interdigital transducer electrode.

The acoustic wave device can further include a carrier substrate and a dispersion adjustment layer, in which the piezoelectric layer is over the carrier substrate and the dispersion adjustment layer is positioned over the interdigital transducer electrode.

The acoustic wave device can be a surface acoustic wave resonator configure to generate a surface acoustic wave. In some instances, the surface acoustic wave resonator can be a temperature compensated surface acoustic wave resonator.

The piston mode structure can include an end portion of a finger of the fingers, in which the end portion includes wider metal than other portions of the finger. The piston mode structure can include an end portion of a finger of the fingers, in which the end portion includes thicker metal than other portions of the finger.

The piston mode structure can include an oxide over an end portion of a finger of the fingers.

The piston mode structure can include dispersion adjustment layer over a central portion of an active region of the interdigital transducer electrode, in which the dispersion adjustment layer is configured to cause a magnitude of a velocity in the central portion of the active region to be greater than the velocity in the boundary region of the acoustic wave device. The dispersion adjustment layer can be a silicon nitride layer. There can be a trench in the dispersion adjustment layer in the boundary region.

The piston mode structure can include a portion of a second bus bar of the interdigital transducer electrode having a lower metal coverage ratio adjacent to an end portion of a finger of the fingers.

Another aspect of this disclosure is acoustic wave resonator that includes a piezoelectric layer, an interdigital transducer electrode on the piezoelectric layer, and a piston mode structure arranged to create a slow velocity boundary region of the acoustic wave device. The interdigital transducer electrode includes a bent section arranged to create a curvature in a waveguide of the acoustic wave device to thereby suppress a transverse spurious mode of the acoustic wave device.

The bent section can have a bend angle in a range from 1° to 20°. The bent section can have a bend angle in a range from 10° to 20°.

The acoustic wave device can include a temperature compensation layer over the interdigital transducer electrode. The acoustic wave device can be a temperature compensated surface acoustic wave resonator configure to generate a surface acoustic wave.

The interdigital transducer electrode can include a bus bar that consists essentially of an arcuate section. The interdigital transducer electrode can include a straight section.

The piston mode structure can include an end portion of a finger of the fingers, in which the end portion includes wider metal than other portions of the finger. The piston mode structure can include an end portion of a finger of the fingers, in which the end portion includes thicker metal than other portions of the finger.

The piston mode structure can include an oxide over an end portion of a finger of the fingers.

The piston mode structure can include dispersion adjustment layer over a central portion of an active region of the interdigital transducer electrode, in which the dispersion adjustment layer is configured to cause a magnitude of a velocity in the central portion of the active region to be greater than the velocity in the boundary region of the acoustic wave device. The dispersion adjustment layer can be a silicon nitride layer. There can be a trench in the dispersion adjustment layer in the boundary region.

The piston mode structure can include a portion of a second bus bar of the interdigital transducer electrode having a lower metal coverage ratio adjacent to an end portion of a finger of the fingers.

Another aspect of this disclosure is an acoustic wave filter that includes acoustic wave resonators. The acoustic wave resonators include an acoustic wave resonator in accordance with any suitable principles and advantages disclosed herein. The acoustic wave filter is configured to filter a radio frequency signal.

The acoustic wave resonator can be a shunt acoustic wave resonator. The acoustic wave filter can be a band pass filter.

The acoustic wave filter can be included in a wireless communication device that also includes an antenna in communication with the acoustic wave filter.

Another aspect to this disclosure is a method of filtering a radio frequency signal. The method includes providing the radio frequency signal to an acoustic wave filter that includes a bent acoustic wave resonator. The method includes filtering the radio frequency signal with the acoustic wave filter. The method also includes during the filtering, suppressing a transverse spurious mode of the bent acoustic wave resonator. The bent acoustic wave resonator includes a bent section arranged to create a curvature in a waveguide of the bent acoustic wave resonator to thereby suppress the transverse spurious mode.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIGS. 12A to 12J are diagrams of interdigital transducer (IDT) electrodes of acoustic wave resonators with a piston mode structure according to various embodiments. FIG. 12A illustrates an IDT electrode with fingers having hammer head shaped end portions. FIG. 12B illustrates an IDT electrode with thicker portions for both border regions of each finger. FIG. 12C illustrates an IDT electrode with fingers having hammer head shaped end portions and bus bars having extension portions adjacent to the end portions of the fingers. FIG. 12D illustrates an IDT electrode with thicker end portions on border regions of each finger and bus bars having extension portions adjacent to end portions of the fingers. FIG. 12E illustrates an IDT electrode with fingers having thicker end portions and thicker regions extending from a bus bar toward a central portion of an active region. FIG. 12F illustrates an IDT electrode with bus bars having holes. FIG. 12G illustrates another IDT electrode with bus bars having holes. FIG. 12H illustrates an IDT electrode with fingers having thicker metal on both border regions. FIG. 12I illustrates an IDT electrode with fingers having an oxide over border regions. FIG. 12J illustrates an IDT electrode with fingers having silicon nitride over a central portion of an active region and border regions free from silicon nitride.

FIG. 16A illustrates a Lamb wave resonator with a grounded electrode. FIG. 16B illustrates a Lamb wave resonator with a floating electrode. FIG. 16C illustrates a Lamb wave resonator without an electrode on a side of a piezoelectric layer that opposes an interdigital transducer (IDT) electrode. FIG. 16D illustrates another Lamb wave resonator. FIG. 16E illustrates another Lamb wave resonator. FIG. 16F illustrates another Lamb wave resonator.

FIG. 17A illustrates a Lamb wave resonator with a grounded electrode. FIG. 17B illustrates a Lamb wave resonator with a floating electrode. FIG. 17C illustrates a Lamb wave resonator without an electrode on a side of a piezoelectric layer that opposes an IDT electrode. FIG. 17D illustrates another Lamb wave resonator. FIG. 17E illustrates another Lamb wave resonator. FIG. 17F illustrates another Lamb wave resonator.

DETAILED DESCRIPTION OF CERTAIN EMBODIMENTS

Figure 1:
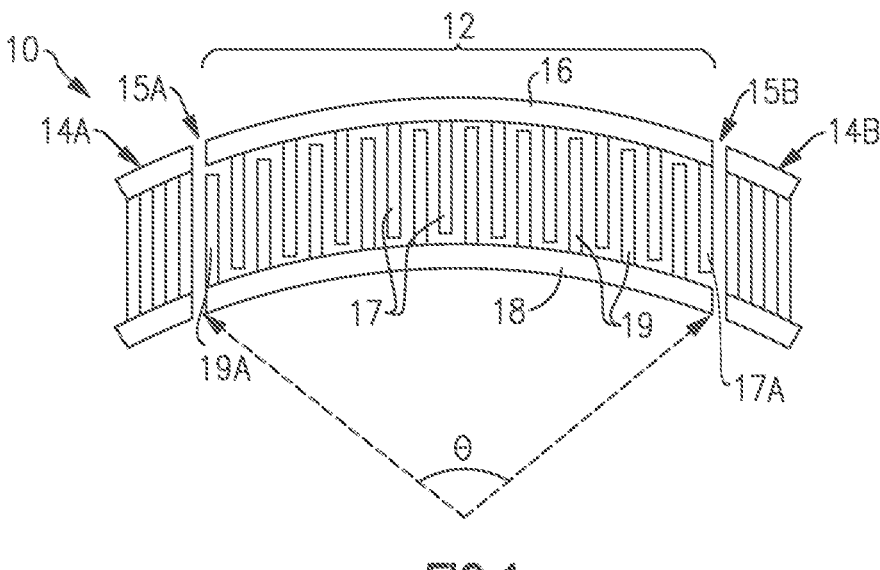
FIG. 1 illustrates an acoustic wave resonator according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

With the explosive growth of mobile communication, the frequency spectrum is becoming crowded. This can generate demanding specifications for radio frequency (RF) filters and duplexers with steep roll-off, low temperature drift, low insertion loss, miniature size, the like, or any combination thereof. Bulk acoustic wave (BAW) filters can include a film bulk acoustic resonator (FBAR) filters and/or a solidly mounted resonator (SMR). Such BAW filters can fulfill the demanding specifications for RF filters in certain applications. Surface acoustic wave (SAW) filters typically have higher frequency drift over temperature. Such SAW filters may encounter difficulty in meeting stringent filter specifications. However, BAW filters are generally more expensive and larger in size than SAW filters.

Temperature-compensated surface acoustic wave (TC-SAW) filters can overcome the frequency drift over temperature of certain SAW filters. Such TC-SAW filters can combine a piezoelectric layer and a low thermal expansion layer together to achieve low temperature drift operation. TC-SAW structures include (1) lithium tantalate (LT) on sapphire/silicon/or other crystal substrates or (2) silicon dioxide (SiO$_2$) on lithium niobate (LN). The TC-SAW structures that include LT on sapphire/silicon or other crystal substrates can be referred to as multi-layer piezoelectric substrate acoustic wave resonator, where a layer of LT is bonded on sapphire/silicon and thinned down to sub-micron thickness. The price related to bonding, thinning and thickness control remains an issue for mass production for this type of filter. Other TC-SAW structures include silicon dioxide that coats over interdigital transducer electrode fingers on an LN substrate, such as a 128° YX-cut LN substrate. The silicon dioxide layer can compensate for the relatively large temperature coefficient of frequency (TCF) of the LN substrate.

TC-SAW resonators typically operate with a main resonance mode together with transverse modes. TC-SAW filter typically utilize the main resonance mode of each of the resonators of the filter to construct an RF passband and rejection band. Transverse modes in TC-SAW resonators are typically unwanted for filters and transverse modes can appear as spurious modes in the passband of a filter. Spurious modes in the passband increase the noise figure of the filter and cause overall system performance degradation.

TC-SAW filters can be used in RF front-end module products for premium handsets of top tier cellular phone makers. Such TC-SAW filters can have low insertion loss, high rejection level, steep roll-off, and low TCF. However, the layered structure of such TC-SAW resonators can generate relatively strong transverse modes in a resonator waveguide and the transverse modes can appear in a passband of a filter as frequency ripples, causing higher passband loss and/or lower manufacture yields.

In a traditional 128° YX cut LN TC-SAW resonator, the resonator is straight. The acoustic wave is generated by the interdigital transducer (IDT) fingers and the main wave motion is Rayleigh wave. Due to the slowness curve in the propagation direction, transverse modes can be generated in the acoustic waveguide.

Aspects of this disclosure relate to reducing the impact of transverse spurious modes by bending a TC-SAW resonator waveguide to leak out the transverse modes. Based on the fact that higher waveguide modes have larger bending loss than fundamental mode, a bent resonator can be used to suppress transverse mode in the resonator waveguide. According to waveguide theory, higher mode has a higher oblique incidence angle.

The incident angle can be relatively close to a Snell angle at the boundary. With a relatively small bending angle, the fundamental mode can encounter insignificant loss while higher transverse mode encounters higher loss. Bent acoustic wave resonators disclosed herein can modify the boundary condition for transverse mode to achieve transverse mode suppression. The bent resonators disclosed herein can be used together with piston mode operation. Accordingly, piston mode operation together with a bent resonator can provide desirable transverse mode suppression and also to ease the control of the slow velocity region in the piston mode structure and the center frequency of the resonator. Experimental results show the effectiveness of transverse mode suppression mode techniques disclosed herein.

Acoustic wave filters can filter RF signals in a variety of applications, such as in an RF front end of a mobile phone. An acoustic wave filter can be implemented with one or more SAW devices. SAW devices include SAW resonators, SAW delay lines, and multi-mode SAW (MMS) filters (e.g., double-mode SAW (DMS) filters). Although embodiments may be discussed with reference to SAW resonators and/or TC-SAW resonators, the principles and advantages discussed herein can be applied to any suitable SAW device and/or any other suitable acoustic wave device.

In embodiments disclosed herein, acoustic wave resonators include a bent acoustic resonator waveguide. FIG. 1 illustrates a SAW resonator 10 according to an embodiment. The SAW resonator 10 is shown in plan view in FIG. 1. Curvature in a waveguide of the SAW resonator 10 can suppress a transverse spurious mode of the SAW resonator 10. As illustrated, the SAW resonator 10 includes IDT electrode 12 and acoustic reflectors 14A and 14B. The acoustic reflectors 14A and 14B are separated from the IDT electrode 12 by respective gaps 15A and 15B. The IDT electrode 12 includes a first bus bar 16, first IDT fingers 17 extending from the first bus bar 16, a second bus bar 18, and second IDT fingers 19 extending from the second bus bar 18. The first bus bar 16 is curved or arcuate. Similarly, the second bus bar 18 is curved or arcuate. The IDT fingers 17 are shown as being parallel to each other. The IDT fingers 17 can have substantially the same length as each other.

The SAW resonator 10 is illustrated as being bent. The SAW resonator 10 has a bending angle of θ. The bending angle θ in FIG. 1 is the angle between intersecting lines extending from outer edges of outer IDT fingers 17A and 19A of the IDT electrode 12. The bending angle θ is shown off scale in FIG. 1. In FIG. 1, the bending angle θ is an acute angle. A curvature radius of the SAW resonator 10 can be the shortest distance between an outer IDT finger 17A or 19A of the IDT electrode 12 and the intersection point where the lines extending from outer IDT fingers 17A and 19A along the longitudinal direction of outer IDT fingers 17A and 19A, respectively, intersect. The dashed lines in FIG. 1 do not illustrate the curvature radius to scale, as the dashed lines do not extend along a longitudinal direction of outer IDT fingers 17A and 19A. Instead, the dashed lines are intended to show that such lines would intersect at the bending angle θ. The bending angle θ in radians can be defined as the length of the resonator IDT region divided by the curvature radius. In FIG. 1, the length of the IDT region can be defined as the length between outer fingers 17A and 19A of the IDT electrode 12.

Acoustic wave and transverse modes can be generated by IDT fingers 17 and 19. However, the boundary condition for each mode has changed relative to a resonator with a 0 bend angle. For a different mode, the Fresnel transmission coefficient (T) at the boundary can be represented by:

$$T(\theta) = \frac{1}{\pi\theta_c}\left(\frac{2}{\kappa\rho}\right)^{1/3}\left|Ai(\Delta\exp(2\pi/3)\right|^{-2} \quad (1)$$

$$\Delta = \left(\frac{\kappa\rho}{2}\right)^{\frac{2}{3}}(\theta_c^2 - \theta_t^2) \quad (2)$$

In these equations, θc is the complement of the critical angle, κ is the wave vector, θt=(π/2)−θn, where θn is the inclination to the normal. The modulus of the Airy function decreases with increase argument. From Equations (1) and (2), it can be known that when the acoustic wave hits the resonator waveguide boundary, there can be radiation loss due to the transmission coefficient. When the boundary has a curvature, the radiation loss should be higher. The radiation loss can be higher with smaller curvature radius. Also, the higher mode can have a smaller inclination angle to the normal and can be closer to the critical angle. The higher mode can encounter higher bending loss than the fundamental mode does. In this case when the SAW resonator is bent, the fundamental mode can still be guided while the higher transverse modes are leaked out due to the increase in radiation loss.

Compared to other transverse mode suppression techniques, the bent resonator can be implemented by layout changes only without any addition fabrication steps. The bent resonator method can be better than electrode apodization, because apodization typically reduces effective coupling due to the reduction of the TC-SAW aperture at the resonator edges.

Bent TC-SAW resonators and filters including the same can be manufactured using a standard TC-SAW manufacturing process. The substrate of the wafer can be a 128° YX cut lithium niobate (128YX-LN) substrate. The IDT can be formed and then coated with a temperature compensation layer, such as a silicon dioxide layer.

Figure 2:
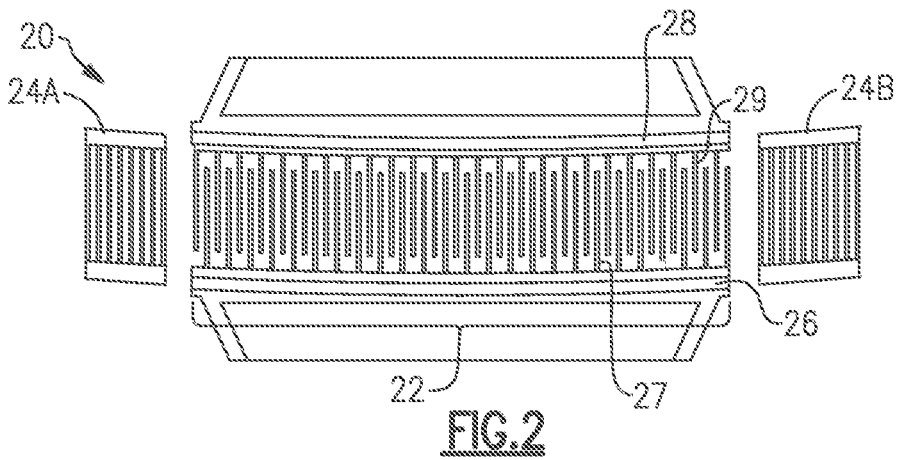
FIG. 2 illustrates a layout of the acoustic wave resonator according to an embodiment

FIG. 2 illustrates a layout of a bent SAW resonator 20 according to an embodiment. As illustrated, the SAW resonator 20 includes IDT electrode 22 and acoustic reflectors 24A and 24B. The IDT electrode 22 includes a first bus bar 26, first IDT fingers 27 extending from the first bus bar 26, a second bus bar 28, and second IDT fingers 29 extending from the second bus bar 28. The first bus bar 26 is curved or arcuate. Similarly, the second bus bar 28 is curved or arcuate. The resonator waveguide of the SAW resonator 20 is bent. The curvature in a waveguide of the SAW resonator 20 can suppress a transverse spurious mode of the SAW resonator 20. The SAW resonator 20 has a relatively small bending angle. This can result in insignificant loss in fundamental mode and higher loss in transverse mode. Accordingly, the SAW resonator 20 can suppress transverse mode and maintain desirable performance for fundamental mode.

Figure 3:
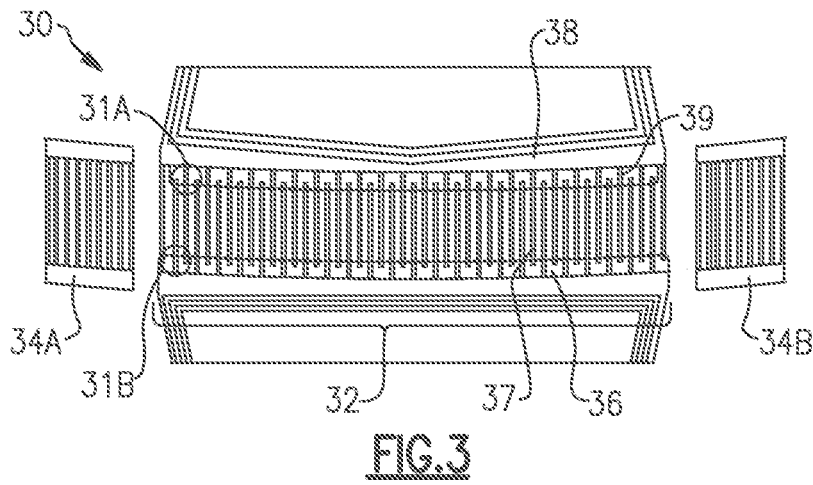
FIG. 3 illustrates a layout of an acoustic wave resonator according to another embodiment.

Bent acoustic wave resonators can also implement piston mode operation. FIG. 3 illustrates a layout of a bent SAW resonator 30 with a piston mode structure according to an embodiment. The illustrated SAW resonator 30 includes piston mode structures 31A and 31B, IDT electrode 32 and acoustic reflectors 34A and 34B. The piston mode structures 31A and 31B can create slower velocity regions on edges of an acoustic aperture of the SAW resonator 30. The slower velocity regions can suppress transverse modes. Example piston mode structures will be discussed with reference to FIGS. 12A to 12J.

In FIG. 3, the piston mode structures 31A and 31B can include a trench in a material, such as silicon nitride that increases velocity in an underlying border region over portions of IDT electrode fingers adjacent to the bus bars. Alternatively, the piston mode structures 31A and 31B can include a material, such as an oxide, that reduces velocity in an underlying border region over portions of IDT fingers adjacent to the bus bars.

The IDT electrode 32 includes a first bus bar 36, first IDT fingers 37 extending from the first bus bar 36, a second bus bar 38, and second IDT fingers 39 extending from the second bus bar 38. The first bus bar 36 is curved or arcuate. Similarly, the second bus bar 38 is curved or arcuate. The resonator waveguide of the SAW resonator 20 is bent. The SAW resonator 20 has a relatively small bending angle. This can result in insignificant loss in fundamental mode and higher loss in transverse mode. Accordingly, the SAW resonator 20 can suppress transverse mode and maintain desirable performance for fundamental mode.

Figure 4:
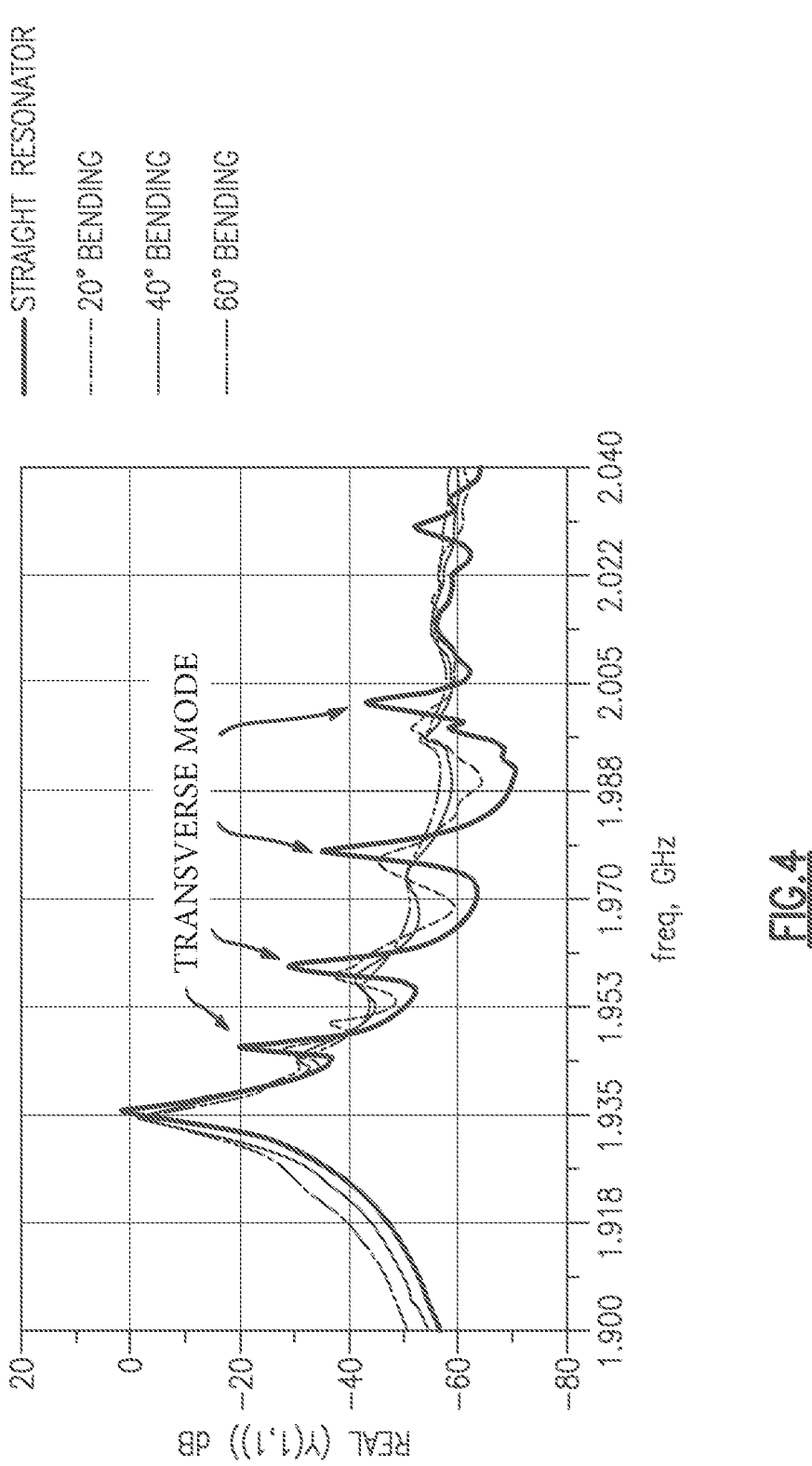
FIG. 4 is a graph of conductance curves of acoustic wave resonators according to embodiments relative to a baseline acoustic wave resonator.

FIG. 4 is a graph of conductance of TC-SAW resonators with different bend angles according to embodiments relative to a straight TC-SAW resonator. The curves in this graph illustrate that transverse spurious modes can be significant between series resonance frequency (fs) and parallel resonance frequency (fp) in the straight TC-SAW resonator curve of FIG. 4. In a filter, the transverse spurious modes can become frequency ripples in the passband of the filter. The transverse spurious modes outside fs and fp can appear in the filter rejection frequency range and may cause spikes in duplexer isolation. In the bent resonator structure, as the bending angle is increased, the transverse spurious mode level greatly reduces as indicated by the 20° and 40° curves of FIG. 4. FIG. 4 illustrates that bent acoustic wave resonators can suppress transverse mode.

Figure 5:
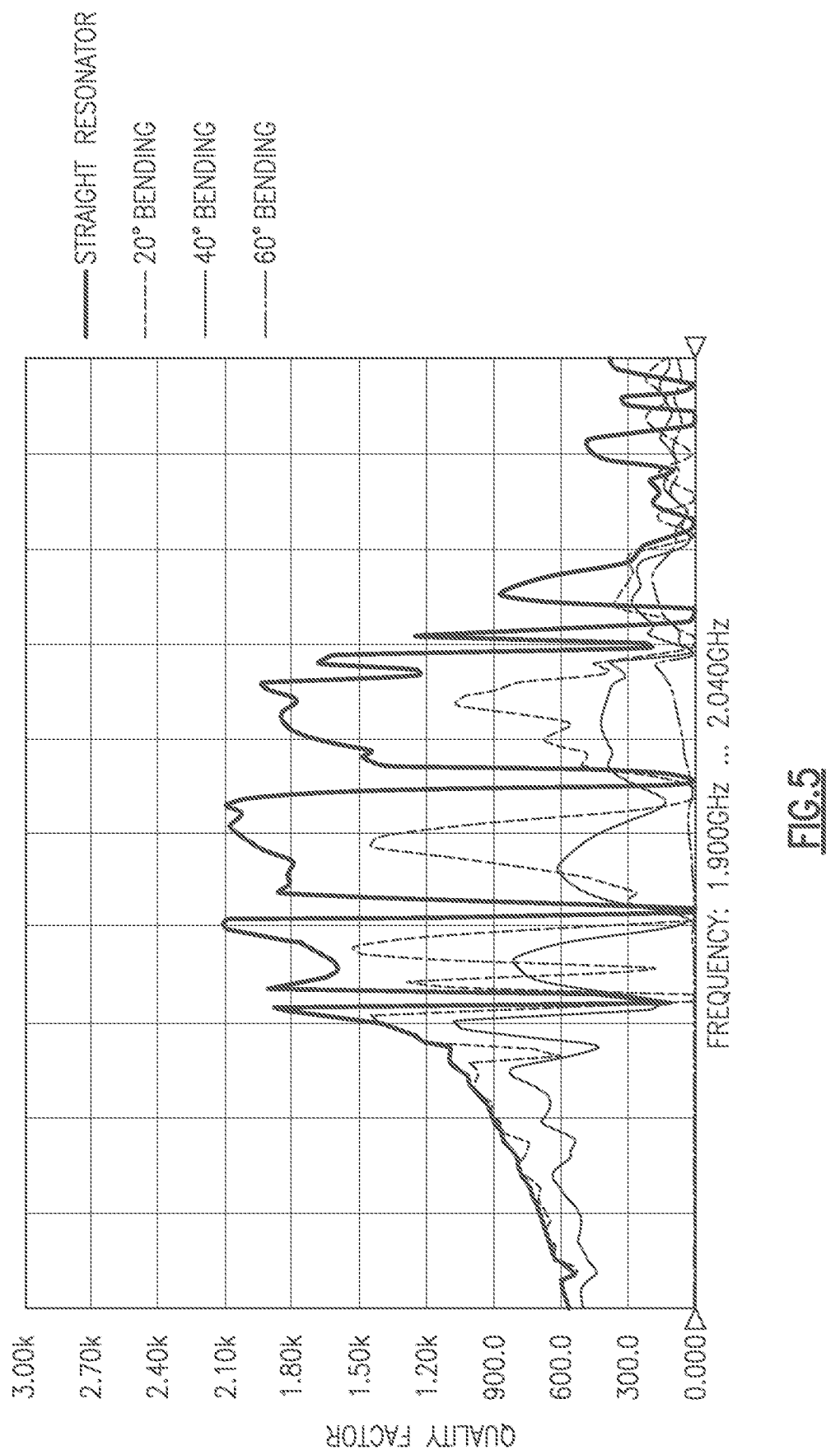
FIG. 5 is a graph of quality factor of acoustic wave resonators according to embodiments relative to a baseline acoustic wave resonator.

FIG. 5 is a graph of quality factor (Q) of TC-SAW resonators with different bend angles according to embodiments relative to a straight TC-SAW resonator. As illustrated by the Q curves, if the bending angle is greater than 20°, the Q of the resonator can start to decrease rapidly. This can be due to the main mode starting to experience significant radiation loss. If the bending angle is less than or equal to about 20°, the transverse mode can be suppressed while the Q of the resonator is preserved. Accordingly, it can be desirable for an acoustic wave resonator to have a bend angle that is greater than 0° and less than or equal to 20°. In some instances, it can be desirable for an acoustic wave resonator to have a bend angle is a range from about 10° to 20°.

Figure 6:
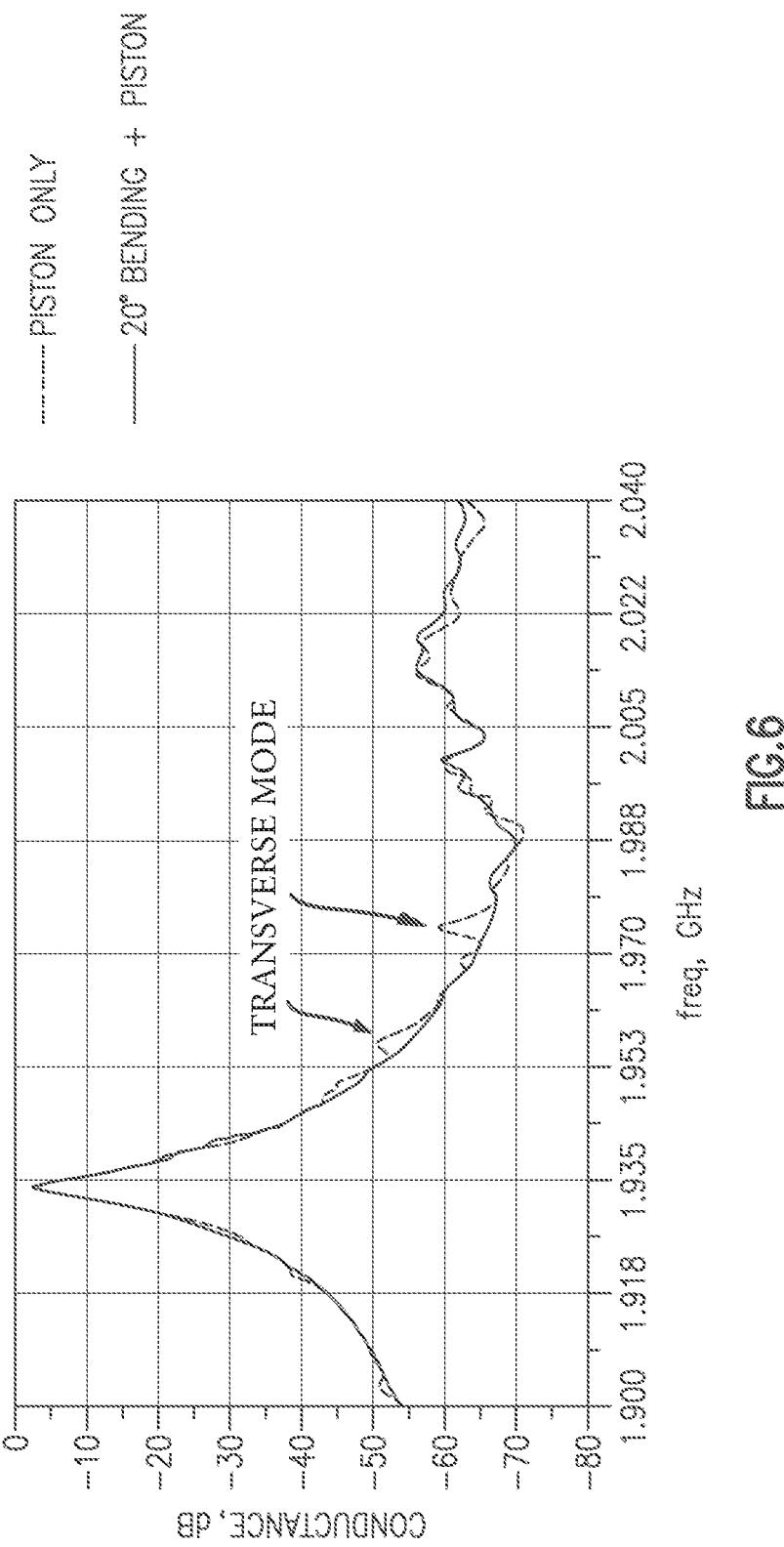
FIG. 6 is a graph comparing conductance curve of an acoustic wave resonator with piston mode to an acoustic wave resonator with piston mode according to an embodiment.

Piston mode techniques can be applied in combination with bent resonator techniques to reduce transverse spurious modes. FIG. 6 is a graph comparing conductance of an acoustic wave resonator with piston mode to an acoustic wave resonator with a bent resonator and piston mode according to an embodiment. FIG. 6 indicates that a resonator with piston mode only may only partially remove transverse modes. By combining the bent resonator structure with a 20° bending angle and piston mode, the transverse modes can be completely (or almost completely) removed. The piston mode transverse suppression technique corresponding to this graph is based on selectively etching a silicon nitride layer at the resonator edge to create a velocity difference on the IDT region and the edge region to suppress the excitation of transverse modes. Cross-wafer variation of the etching trench can cause the degree of suppression to vary. The bent resonators should not have such a problem because the suppression level due to bending can depend on the bending angle, which can be reliably manufactured.

Figure 7:
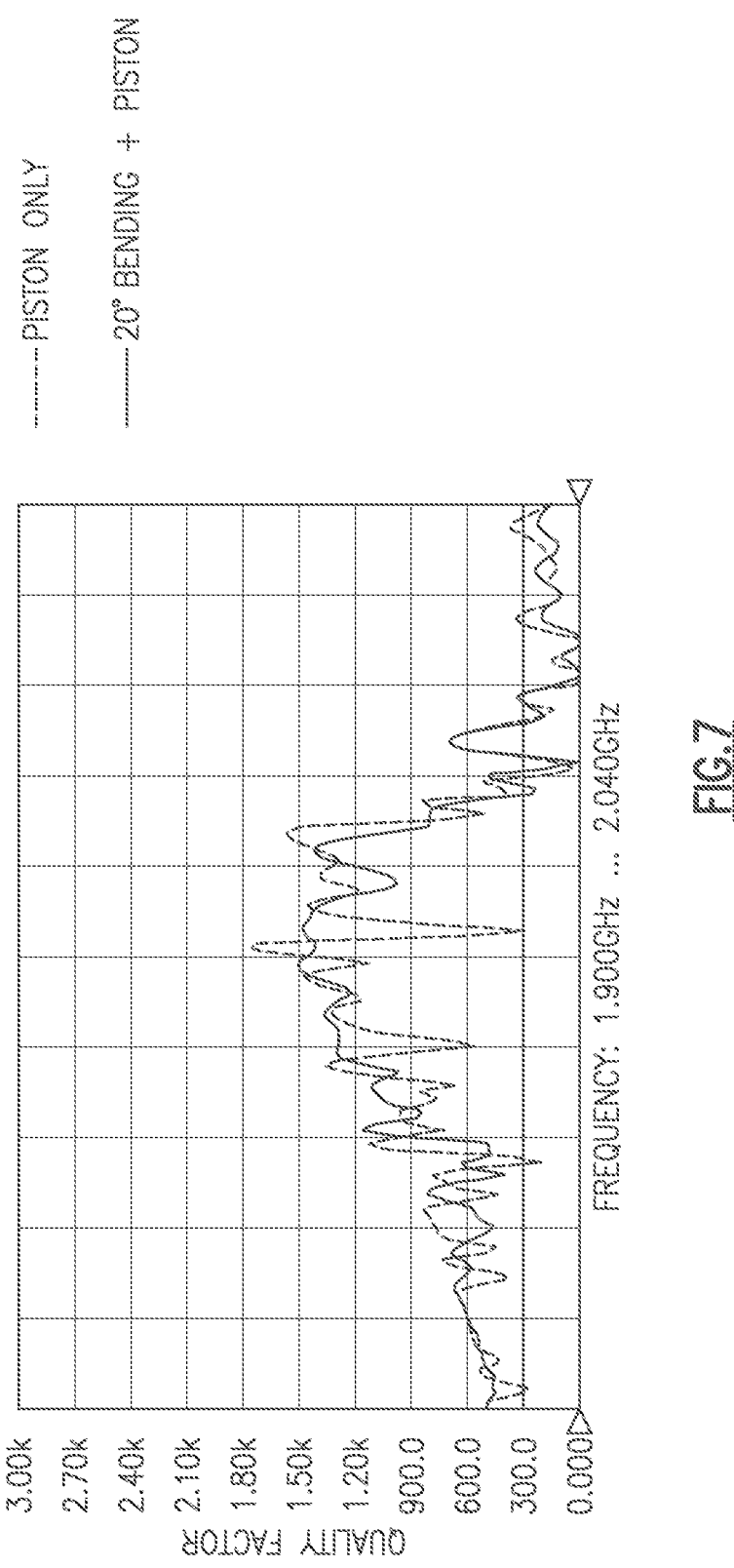
FIG. 7 is a graph comparing quality factor of an acoustic wave resonator with piston mode to an acoustic wave resonator with a piston mode technique according to an embodiment.

FIG. 7 is a graph comparing quality factor of an acoustic wave resonator with piston mode to an acoustic wave resonator with a bent resonator and piston mode according to an embodiment. This graph indicates that the quality factor is similar for the acoustic wave resonator with piston mode and the acoustic wave resonator with a 20° bending angle and piston mode. In FIG. 7, no significant loss is observed due to the bending angle. Excitation efficiency is substantially the same for the acoustic wave resonators corresponding to the curves illustrated in FIG. 7.

Figure 8:
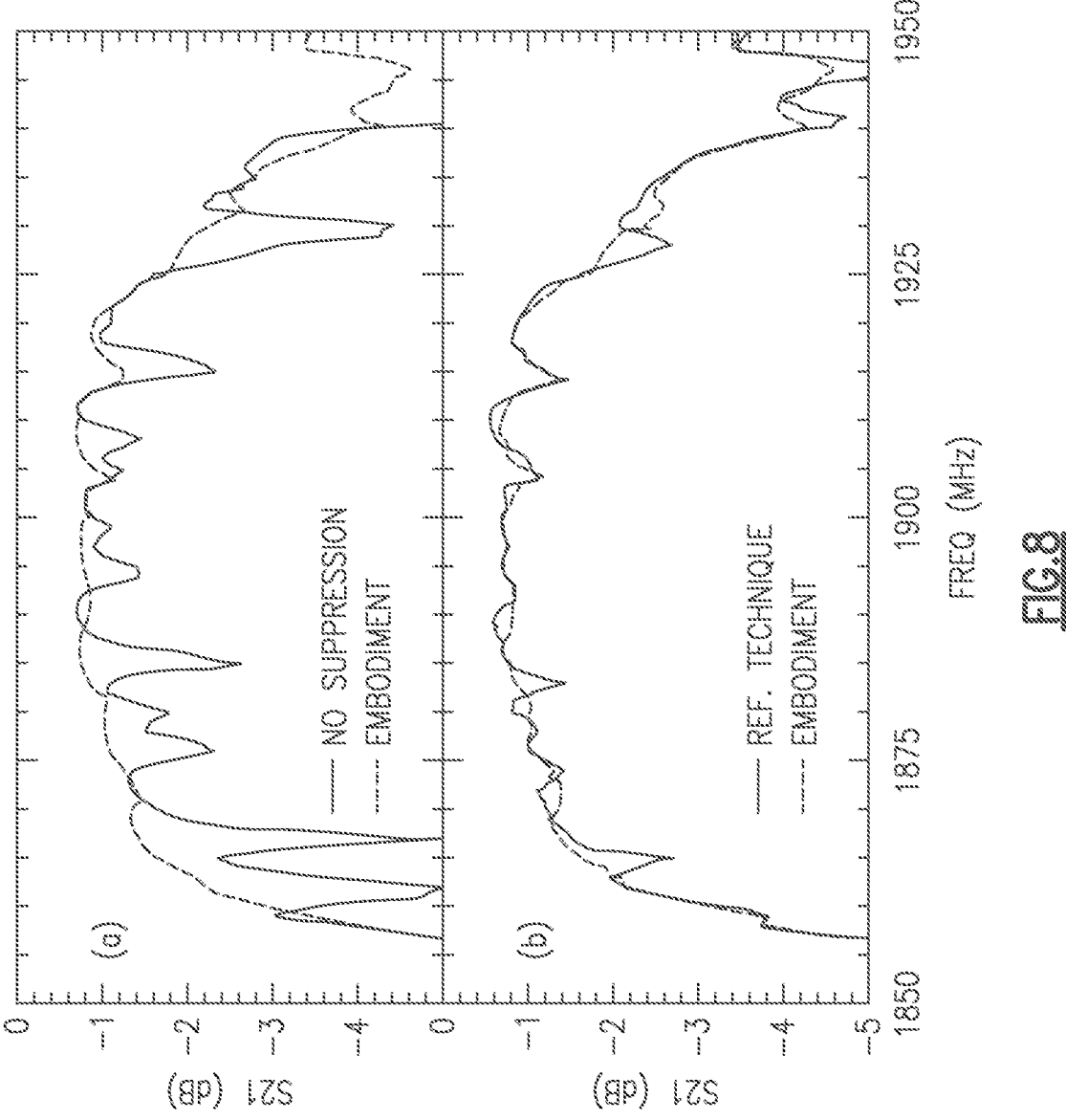
FIG. 8 includes graphs of measured insertion loss for Long Term Evolution band 39 for (a) an acoustic wave resonator with piston mode according to an embodiment compared to an acoustic wave resonator without any transverse mode suppression technique and (b) an acoustic wave resonator with piston mode according to an embodiment compared to an acoustic wave resonator with a piston mode technique.

FIG. 8 includes graphs of measured insertion loss for Long Term Evolution band 39 for (a) an acoustic wave filter with piston mode according to an embodiment compared to an acoustic wave filter without any transverse mode suppression technique and (b) an acoustic wave filter with piston mode according to an embodiment compared to an acoustic wave filter with a piston mode technique. FIG. 8 shows the measured insertion loss of an LTE band 39 filter.

The top portion of FIG. 8 shows the insertion loss difference between (1) a filter with a bent resonator structure and a piston mode suppression technique and (2) a corresponding filter without any transverse mode suppression. The passband ripples can cause significant performance degradation if there is no transverse mode suppression.

The bottom portion of FIG. 8 shows the performance difference between (1) a filter with a bent resonator structure together with a piston mode technique and (2) a corresponding filter with a reference technique which is only the piston mode technique. This graph indicates that the piston mode technique does not completely remove transverse spurious modes, but the bent resonator structure with piston mode can further remove ripples. The bent resonator structure with piston mode can remove the ripples completely or almost completely as shown in FIG. 8.

Figure 9:
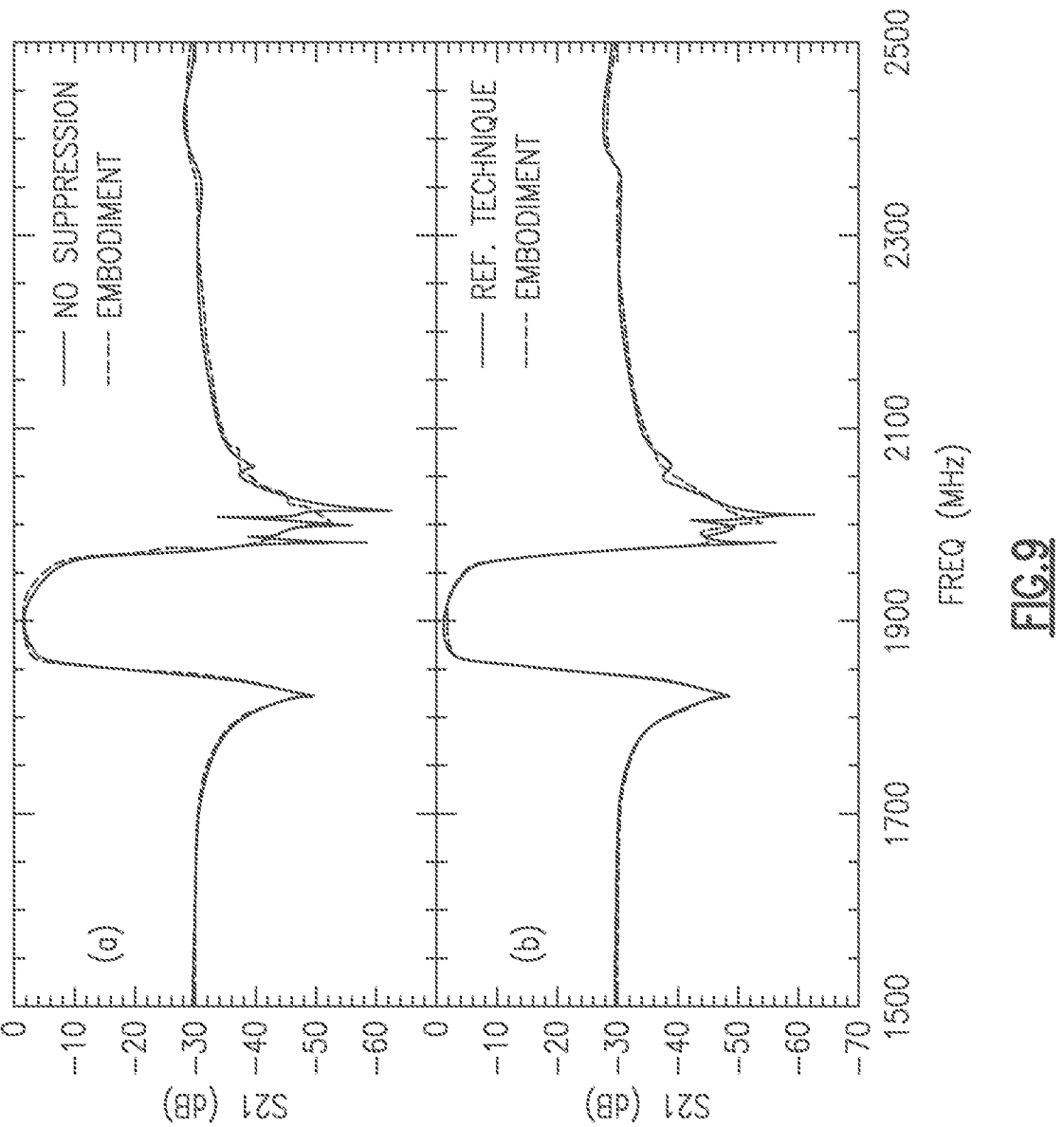
FIG. 9 includes graphs of measured rejection for Long Term Evolution band 39 for (a) an acoustic wave resonator with piston mode according to an embodiment compared to an acoustic wave resonator without any transverse mode suppression technique and (b) an acoustic wave resonator with piston mode according to an embodiment compared to an acoustic wave resonator with a piston mode technique.

FIG. 9 includes graphs of measured rejection for Long Term Evolution band 39 for (a) an acoustic wave filter with piston mode according to an embodiment compared to an acoustic wave filter without any transverse mode suppression technique and (b) an acoustic wave filter with piston mode according to an embodiment compared to an acoustic wave filter with a reference technique which is only a piston mode technique. FIG. 9 shows the rejection level of LTE band 39 filters. This figure illustrates that spikes can also be removed outside the passband using the bent resonator structure.

Accordingly, measurement results indicate that bent acoustic wave resonators can better suppress transverse mode than baseline acoustic wave resonators. No significant insertion loss or bandwidth degradation is observed due to the bending of the bent acoustic wave resonator. Depending on the implementation, the physical area of a filter can increase slightly due to implementing bent resonators.

Bent resonators can be substantially arcuate or curved. For example, the acoustic wave resonators of FIGS. 1 to 3 include bus bars that consist essentially of an arcuate section. Transverse mode suppression can be realized in acoustic wave resonators in which only a portion of an acoustic aperture is curved and/or an acoustic aperture with two or more curved portions. With at least a portion of the acoustic aperture being curved, transverse mode can be suppressed.

Figure 10:
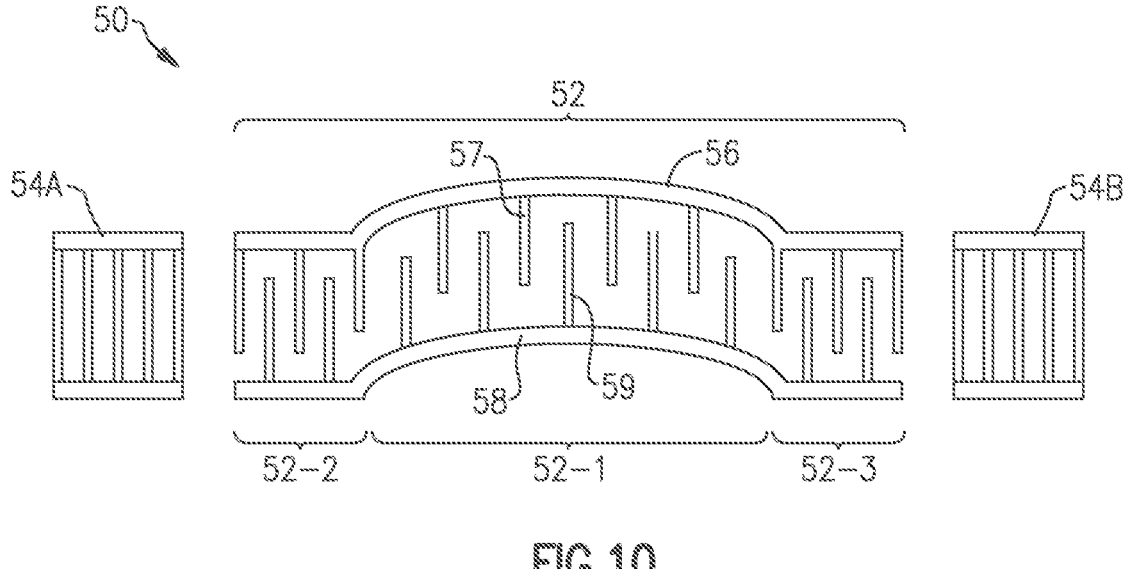
FIG. 10 illustrates an acoustic wave resonator according to another embodiment.

FIG. 10 illustrates an acoustic wave resonator 50 according to an embodiment. The acoustic wave resonator 50 has an acoustic aperture with a curved section and straight sections. The acoustic wave resonator 50 is shown in plan view in FIG. 10. As illustrated, the acoustic wave resonator 50 includes IDT electrode 52 and acoustic reflectors 54A and 54B. The acoustic reflectors 54A and 54B are separated from the IDT electrode 52 by respective gaps. The IDT electrode 52 includes a first bus bar 56, first IDT fingers 57 extending from the first bus bar 56, a second bus bar 58, and second IDT finger 59 extending from the second bus bar 58.

As shown in FIG. 10, the IDT electrode 52 includes a bent section 52-1 and straight sections 52-2 and 52-3. The bent section 52-1 can suppress transverse modes. The bent section 52-2 can alternatively be referred to as a curved section or an arcuate section. The bent section 52-2 has a bending angle. The bending angle can be the angle between intersecting lines extending from outer edges of outer IDT fingers of the bent section 52-1. The straight sections 52-2 and 52-3 do not have a bending angle. Lines extending from edges of any two IDT fingers of the straight section 52-2 should be substantially parallel to each other. Similarly, lines extending from edges of any two IDT fingers of the straight section 52-2 should be substantially parallel to each other.

Figure 11:
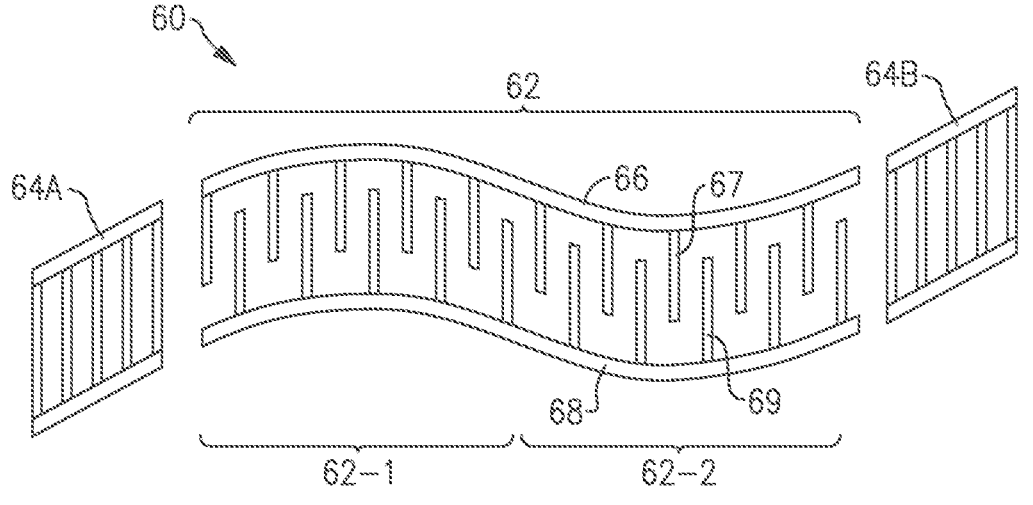
FIG. 11 illustrates an acoustic wave resonator according to another embodiment.

FIG. 11 illustrates an acoustic wave resonator 60 according to an embodiment. The acoustic wave resonator 60 has an acoustic aperture with a plurality of curved sections. The acoustic wave resonator 60 is shown in plan view in FIG. 11. As illustrated, the acoustic wave resonator 60 includes IDT electrode 62 and acoustic reflectors 64A and 64B. The acoustic reflectors 64A and 64B are separated from the IDT electrode 62 by respective gaps. The IDT electrode 62 includes a first bus bar 66, first IDT fingers 67 extending from the first bus bar 66, a second bus bar 68, and second IDT finger 69 extending from the second bus bar 68.

As shown in FIG. 11, the IDT electrode 62 includes a first bent section 62-1 and a second bent section 62-2. The bent sections 62-1 and 62-2 can suppress transverse modes. The bent sections each have a bending angle. The bending angle of a bent section can refer to the angle between intersecting lines extending from outer edges of outer IDT fingers of a bent section.

As discussed above, a bent acoustic wave resonator can also include a piston mode structure. Piston mode structures can be implemented with any suitable acoustic wave resonator disclosed herein. Acoustic wave resonators with piston mode structures can be implemented a variety of ways. As an example, a metal layout of an interdigital transducer electrode of an acoustic wave resonator can contribute to a velocity in a border region having a lower magnitude than a velocity in a central portion of an active region. For instance, an end portion of an interdigital transducer electrode finger can have wider metal than the rest of the finger. Alternatively or additionally, a bus bar can have a lower metal coverage ratio adjacent to an end portion of an interdigital transducer finger. As another example, a layer over an interdigital transducer electrode can contribute to a velocity in a border region having a lower magnitude than a velocity in a central portion of an active region. Such a layer can be over the central portion of the active region to increase the magnitude of the velocity in the central portion of the active region relative to the border region. Alternatively or additionally, a layer over the border region can reduce the velocity of the border region relative to the central portion of the active region.

Example embodiments of acoustic wave resonators with a piston mode structure will be discussed with reference to FIGS. 12A to 12J. In the acoustic wave resonators of any of FIGS. 12A to 12J, an IDT electrode can be included in any suitable acoustic wave resonator, such as a SAW resonator, a TC-SAW resonator, a multi-layer piezoelectric substrate acoustic wave resonator, a SAW delay line, a multi-mode SAW filter with longitudinally coupled IDT electrodes, a Lamb wave resonator, or a boundary wave resonator. Any suitable principles and advantages of these embodiments can be combined with each other. Any suitable principles and advantages of the embodiments with a piston mode structure can be implemented in a bent acoustic wave resonator in accordance with any suitable features disclosed herein. Although a portion of an IDT electrode is illustrated in FIGS. 12A to 12J, these IDT electrodes can include bus bars that include a curved and/or arcuate portion.

Figures 12A, 12B, 12C, 12D, 12E:
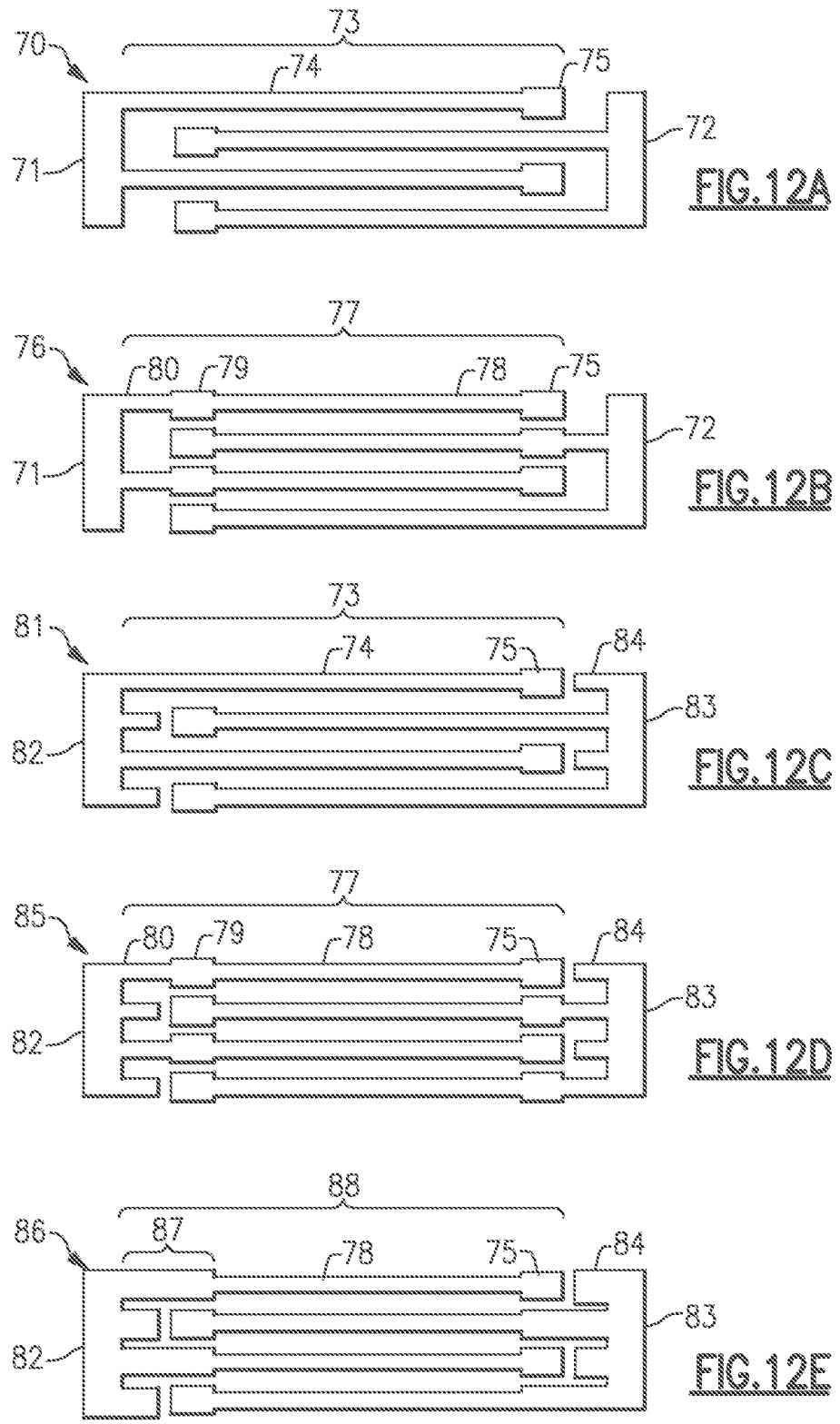

FIG. 12A illustrates a portion of an IDT electrode 70 of an acoustic wave resonator according to an embodiment. The IDT electrode 70 includes fingers having hammer head shaped end portions. The IDT electrode 70 includes bus bars 71 and 72 and a plurality of fingers extending from the bus bars 71 and 72. As illustrated, each of the fingers of the IDT electrode 70 are substantially the same as each other. Finger 73 will be discussed as an example. Finger 73 has a body portion 74 that extends from bus bar 71 and an end portion 75. The end portion 75 is adjacent to the bus bar 72. The end portion 75 is wider that the rest of the finger 73. The end portion 75 is hammer head shaped in plan view. The end portions of the fingers of the IDT electrode 70 are piston mode structures.

FIG. 12B illustrates a portion of an IDT electrode 76 of an acoustic wave resonator according to another embodiment. The IDT electrode 76 includes fingers with thicker portions for both border regions of each finger. The IDT electrode 76 is like the IDT electrode 70 of FIG. 12A except that the fingers of the IDT electrode 76 are wider adjacent to both bus bars 71 and 72. Finger 77 will be discussed as an example. Finger 77 has a bus bar connection portion 80 that extends from bus bar 71, a widened portion 79, a body portion 78, and an end portion 75. Both the end portion 75 and the widened portion 79 are wider than the other portions of the finger 77. The widened portion 79 and the end portion 75 of the finger 73 are included in border regions on opposing sides of the active region of the acoustic wave resonator that includes the IDT electrode 76. The end portions and widened portions of the fingers of the IDT electrode 76 are piston mode structures.

FIG. 12C illustrates a portion of an IDT electrode 81 of an acoustic wave resonator according to another embodiment. The IDT electrode 81 includes fingers having hammer head shaped end portions and bus bars having extension portions adjacent to the end portions of the fingers. The IDT electrode 81 is like the IDT electrode 70 of FIG. 12A except that the bus bars of the IDT electrode 81 have extension portions adjacent to end portions of fingers. Bus bars 82 and 83 each include extension portions, such as extension portion 84, adjacent to end portions of fingers of the IDT electrode 81. The Extension portions of the bus bars 82 and 83 can increase the metal coverage ratio around the border regions relative to the central portion of the active region of the acoustic wave resonator. The end portions of the finger and extension portions of the bus bars of the IDT electrode 81 are piston mode structures.

FIG. 12D illustrates a portion of an IDT electrode 85 of an acoustic wave resonator according to another embodiment. The IDT electrode 85 has thicker end portions on border regions of each finger and bus bars having extension portions adjacent to end portions of the fingers. The IDT electrode 85 includes features of the IDT electrode 81 of FIG. 12C and the IDT electrode 76 of FIG. 12B.

FIG. 12E illustrates a portion of an IDT electrode 86 of an acoustic wave resonator according to another embodiment. The IDT electrode 86 includes fingers having thicker end portions and thicker regions extending from a bus bar toward a central portion of an active region of the acoustic wave resonator. The IDT electrode 86 is similar to the IDT electrode 81 of FIG. 12C except the fingers of IDT electrode 86 include a widened portion extending from bus bars. As shown in FIG. 12E, finger 88 of the IDT electrode 86 includes widened portion 87 extending from the bus bar 82 to body portion 78. The finger 88 also includes end portion 75.

FIG. 12F illustrates a portion of an IDT electrode 90 of an acoustic wave resonator according to another embodiment. The IDT electrode 90 includes bus bars 92 and 94 and fingers 93 and 95 extending from the respective bus bars. The bus bars 92 and 94 have holes 96 and 97, respectively. The holes 96 and 97 are adjacent to ends of the fingers 95 and 93, respectively. The holes 96 and 97 can reduce a metal coverage ratio adjacent to border regions of the acoustic wave resonator. The holes 96 and 97 are piston mode structures.

FIG. 12G illustrates a portion of an IDT electrode 100 of an acoustic wave resonator according to another embodiment. The IDT electrode 100 is like the IDT electrode 90 of FIG. 12F except that the bus bars have different holes. As illustrated in FIG. 12G, the IDT electrode 100 includes bus bars 102 and 104 having holes 105, 106 and 107, 108, respectively.

FIG. 12H illustrates a portion of an IDT electrode 110 of an acoustic wave resonator according to another embodiment. The IDT electrode 110 includes bus bars 71 and 72 and fingers 112 and 115 extending from the bus bars 71 and 72, respectively. The finger 112 has thicker metal in border region portions 113 and 114 that the rest of the finger 112. Similarly, the finger 114 has thicker metal in border region portions 116 and 117 than in other portions of the finger 114. Thicker metal can provide similar functionality as wider metal.

FIG. 12I illustrates a portion of an IDT electrode 120 of an acoustic wave resonator according to an embodiment. The IDT electrode 120 has an oxide over border regions 122A and 122B of the IDT electrode 120. The oxide can cause a magnitude of the velocity in the border regions to be less than the velocity in the central portion of the active region of the acoustic wave resonator. Any other suitable material can be included over border regions 102A and 122B to reduce the magnitude of the velocity of the border regions relative to the central portion of the active region. The oxide can be silicon dioxide, for example.

FIG. 12J illustrates a portion of an IDT electrode 130 of an acoustic wave resonator according to another embodiment. The IDT electrode 130 has silicon nitride over a central portion 132 of the active region of the IDT electrode 130. The silicon nitride can cause a magnitude of the velocity in the active region to be greater than the velocity in a border region of the acoustic wave resonator. Any other suitable material can be included over the central portion 132 to of the active region increase the magnitude of the velocity of the central portion of the active region relative to the border regions. In some instances, a trench in silicon nitride or another suitable material overlying the IDT electrode 130 can create a slower velocity border region.

Any suitable acoustic wave resonator with an IDT electrode can include a bent structure to suppress a transverse mode. Such acoustic wave resonators include SAW resonators, TC-SAW resonators, SAW resonators with multi-layer piezoelectric substrates, Lamb wave resonators, and boundary wave resonators. Any suitable combination of features of bent resonators and/or best resonators with piston mode structure disclosed herein can be implemented in such an acoustic wave resonator. Cross sections of example acoustic wave resonators that can include curvature in a waveguide of the acoustic wave resonator will be described with reference to FIGS. 13 to 17F.

Figure 13:
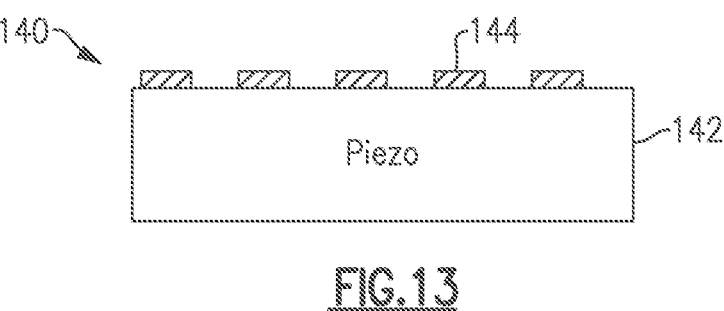
FIG. 13 is a cross sectional view of a portion of a surface acoustic wave resonator according to an embodiment.

FIG. 13 is a cross sectional view of a portion of a surface acoustic wave resonator 140 according to an embodiment. The surface acoustic wave resonator 140 can include a bent section in accordance with any suitable principles and advantages disclosed herein. As illustrated, the surface acoustic wave resonator 140 includes a piezoelectric layer 142 and an IDT electrode 144 on the piezoelectric layer 142. The piezoelectric layer 142 can be any suitable piezoelectric layer, such as a lithium niobate layer, a lithium tantalate layer, or an aluminum nitride layer. The IDT electrode 144 can be in physical contact with the piezoelectric layer 142 as illustrated. The IDT electrode 144 can include aluminum (Al) or any suitable alloy thereof. The IDT electrode 144 can include two or more conductive layers in some instances. Such an IDT electrode 144 can include aluminum (Al) and another conductive layer such as molybdenum (Mo), tungsten (W), gold (Au), silver (Ag), copper (Cu), platinum (Pt), ruthenium (Ru), titanium (Ti), or the like.

Figure 14A:
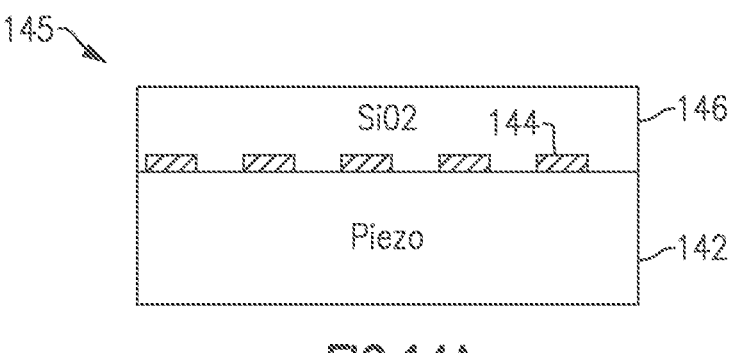
FIG. 14A is a cross sectional view of a portion of a temperature compensated surface acoustic wave resonator according to an embodiment.

FIG. 14A is a cross sectional view of a portion of a temperature compensated surface acoustic wave resonator 145 according to an embodiment. The temperature compensated surface acoustic wave resonator 145 can include a bent section in accordance with any suitable principles and advantages disclosed herein. As illustrated, the temperature compensated surface acoustic wave resonator 140 includes a piezoelectric layer 142 and an IDT electrode 144 on the piezoelectric layer 142, and a temperature compensation layer 146 over the IDT electrode 144. The temperature compensated surface acoustic wave resonator 145 is like the surface acoustic wave resonator 140 of FIG. 13 except that a temperature compensation layer 146 is over the IDT electrode 144 in the temperature compensated surface acoustic wave resonator 145. The temperature compensation layer 146 can bring the TCF of the temperature compensated surface acoustic wave device 145 closer to zero than the TCF of the surface acoustic wave device 140. The temperature compensation layer 146 can have a positive TCF. This can compensative for a negative TCF of the piezoelectric layer 142, as lithium niobate and lithium tantalate both have a negative TCF. The temperature compensation layer 142 can be a dielectric film. The temperature compensation layer 142 can be a silicon dioxide layer. In some other embodiments, a different temperature compensation layer can be implemented. Some examples of other temperature compensation layers include a tellurium dioxide (TeO$_2$) layer or a silicon oxyfluoride (SiOF) layer.

Figure 14B:
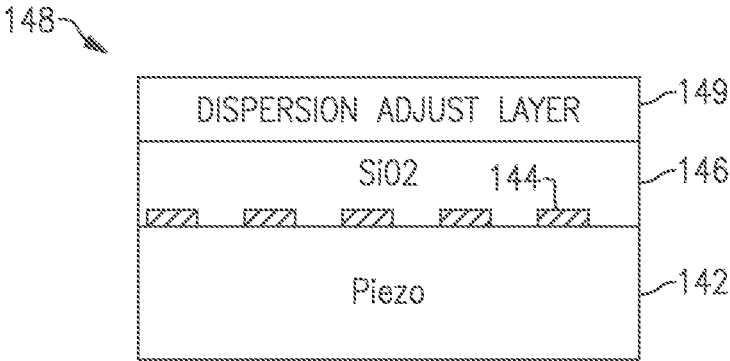
FIG. 14B is a cross sectional view of a portion of a temperature compensated surface acoustic wave resonator according to another embodiment.

FIG. 14B is a cross sectional view of a portion of a temperature compensated surface acoustic wave resonator 148 according to another embodiment. The temperature compensated surface acoustic wave resonator 148 can include a bent section in accordance with any suitable principles and advantages disclosed herein. The temperature compensated surface acoustic wave resonator 148 is like the temperature compensated surface acoustic wave resonator 145 of FIG. 14A except that a dispersion adjustment layer 149 is over the temperature compensation layer 146 in the temperature compensated surface acoustic wave resonator 148. The dispersion adjustment layer 149 can be a silicon nitride layer.

Figure 15A:
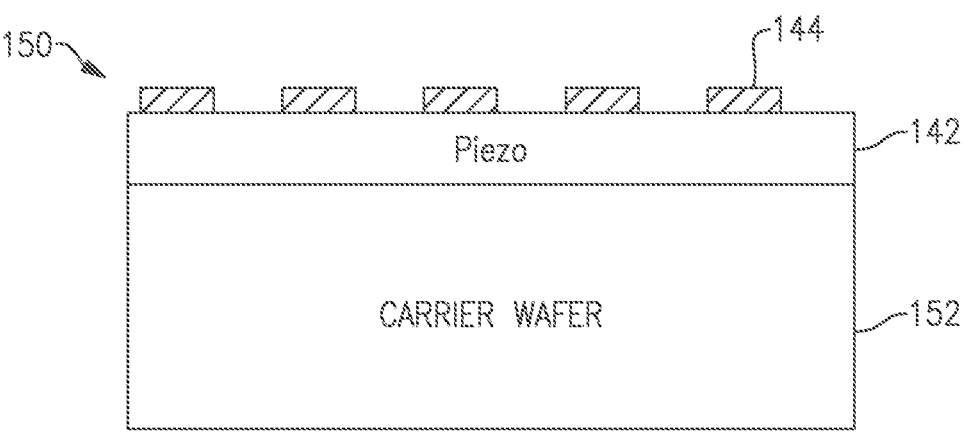
FIG. 15A is a cross sectional view of a portion of a surface acoustic wave resonator with a multi-layer piezoelectric substrate according to an embodiment.

FIG. 15A is a cross sectional view of a portion of a surface acoustic wave resonator 150 with a multi-layer piezoelectric substrate according to an embodiment. The surface acoustic wave resonator 150 is like the surface acoustic wave resonator 140 of FIG. 13 except that the piezoelectric layer 142 is over a carrier substrate 152 in the surface acoustic wave resonator 150. The surface acoustic wave resonator 150 can include a bent section in accordance with any suitable principles and advantages disclosed herein. The carrier substrate 152 can be a silicon substrate, a quartz substrate, a sapphire substrate, a polycrystalline spinel substrate, a magnesium aluminum spinel, a ceramic substrate, a glass substrate, or any other suitable carrier substrate.

Figure 15B:
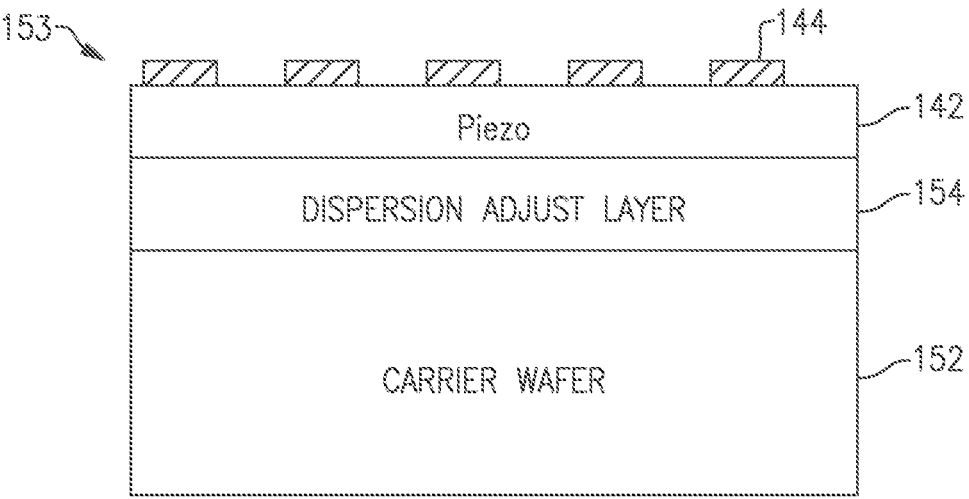
FIG. 15B is a cross sectional view of a portion of a surface acoustic wave resonator with a multi-layer piezoelectric substrate according to another embodiment.

FIG. 15B is a cross sectional view of a portion of a surface acoustic wave resonator 153 with a multi-layer piezoelectric substrate according to another embodiment. The surface acoustic wave resonator 153 is like the surface acoustic wave resonator 150 of FIG. 15A except that a dispersion adjustment layer 154 is included the surface acoustic wave device 155. The surface acoustic wave resonator 153 can include a bent section in accordance with any suitable principles and advantages disclosed herein. The illustrated dispersion adjustment layer 154 is positioned between the carrier substrate 152 and the piezoelectric layer 142. The dispersion adjustment layer 154 can be a silicon nitride layer, a silicon dioxide layer, or any other suitable dispersion adjustment layer. In some instances, the dispersion adjustment layer 154 can increase adhesion between layers. Alternatively or additionally, the dispersion adjustment layer 154 can provide temperature compensation to bring a TCF of the surface acoustic wave resonator 153 closer to zero.

Figure 15C:
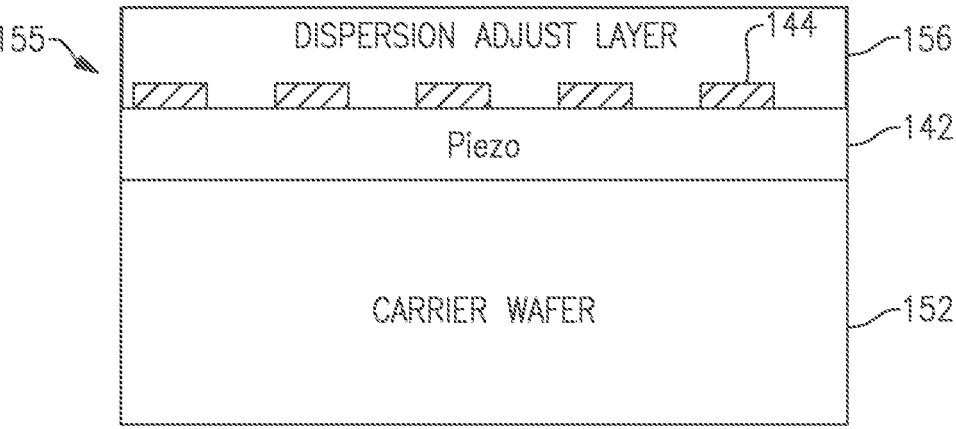
FIG. 15C is a cross sectional view of a portion of a surface acoustic wave resonator with a multi-layer piezoelectric substrate according to another embodiment.

FIG. 15C is a cross sectional view of a portion of a surface acoustic wave resonator 155 with a multi-layer piezoelectric substrate according to another embodiment. The surface acoustic wave resonator 155 is like the surface acoustic wave resonator 150 of FIG. 15A except that a dispersion adjustment layer 156 is included the surface acoustic wave device 155. The surface acoustic wave resonator 155 can include a bent section in accordance with any suitable principles and advantages disclosed herein. The illustrated dispersion adjustment layer 156 is positioned over the IDT electrode 144. The dispersion adjustment layer 156 can be a silicon nitride layer, a silicon dioxide layer, or any other suitable dispersion adjustment layer.

Figure 15D:
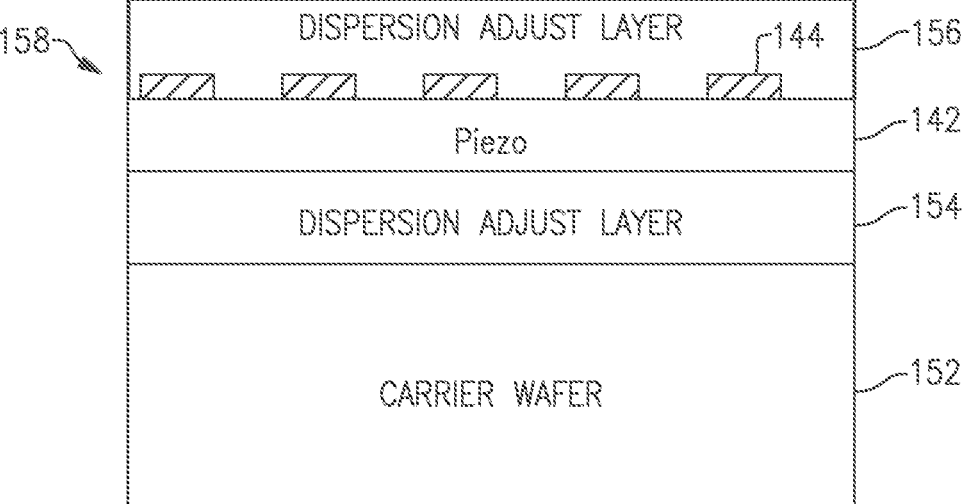
FIG. 15D is a cross sectional view of a portion of a surface acoustic wave resonator with a multi-layer piezoelectric substrate according to another embodiment.

FIG. 15D is a cross sectional view of a portion of a surface acoustic wave resonator 158 with a multi-layer piezoelectric substrate according to another embodiment. The surface acoustic wave resonator 158 is like the surface acoustic wave resonator 153 of FIG. 15B except that a second dispersion adjustment layer 156 is included the surface acoustic wave device 158. The surface acoustic wave resonator 158 can include a bent section in accordance with any suitable principles and advantages disclosed herein. In some instances, the dispersion adjustments layers 154 and 156 can be the same material. The dispersion adjustment layers 154 and 156 can be different materials in certain instances.

Any suitable principles and advantages disclosed herein can be implemented in a Lamb wave resonator. A Lamb wave resonator can include an IDT electrode on a piezoelectric layer and reflective gratings disposed on the piezoelectric layer on opposing sides of the IDT electrode. The reflective gratings can reflect acoustic waves induced by the IDT electrode to form a resonant cavity in such resonators.

The reflective gratings can include a periodic pattern of metal on a piezoelectric layer. FIGS. 16A to 16F are diagrams of cross sections of Lamb wave resonators with gratings. These Lamb wave resonators can be bent resonators in accordance with any suitable principles and advantages discussed herein. For example, a bent acoustic wave resonator can be implemented with any suitable principles and advantages of any of the acoustic wave resonators of FIGS. 16A to 16F. Although the Lamb wave resonators of FIGS. 16A to 16F are free-standing resonators, any suitable principles and advantages of these Lamb wave resonators can be applied to any other suitable acoustic wave resonators.

Figure 16A:
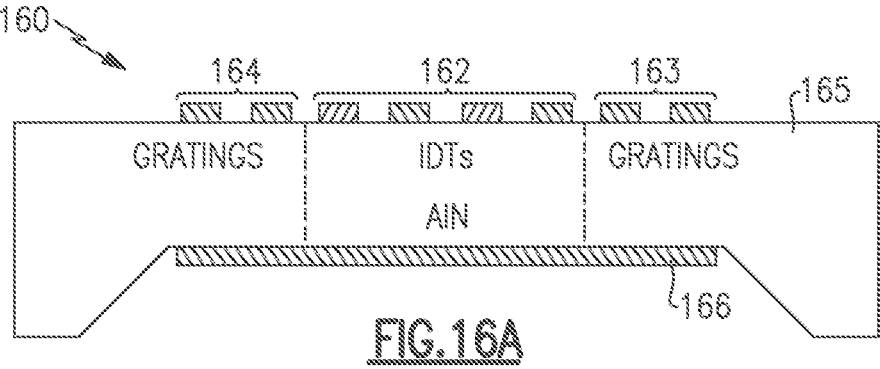
FIGS. 16A to 16F are diagrams of cross sections of Lamb wave resonators with gratings.

FIG. 16A illustrates a Lamb wave resonator 160 that includes an IDT electrode 162, gratings 163 and 164, a piezoelectric layer 165, and an electrode 166. The IDT electrode 162 is on the piezoelectric layer 165. In the illustrated cross section, alternate ground and signal metals are included in the IDT electrodes. Gratings 163 and 165 are on the piezoelectric layer 165 and disposed on opposing sides of the IDT electrode 162. The illustrated gratings 163 and 165 are shown as being connected to ground. Alternatively, one or more of the gratings can be signaled and/or floating. The electrode 166 and the IDT electrode 162 are on opposite sides of the piezoelectric layer 165. The piezoelectric layer 165 can be aluminum nitride (AlN), for example. The electrode 166 can be grounded.

Figure 16B:
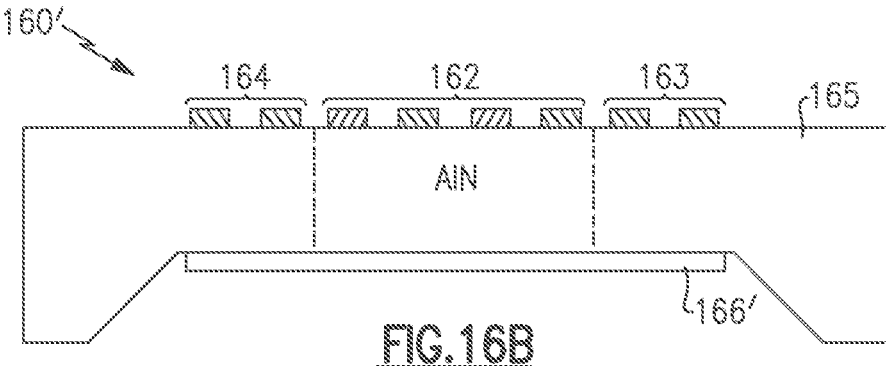

FIG. 16B illustrates a Lamb wave resonator 160'. The Lamb wave resonator 160' is like the Lamb wave resonator 160 of FIG. 16A except that the Lamb wave resonator 160' includes a floating electrode 166'.

Figure 16C:
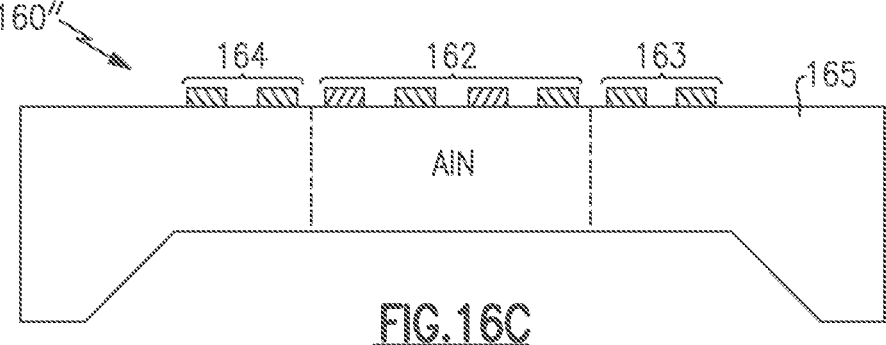

FIG. 16C illustrates a Lamb wave resonator 160" without an electrode on a side of the piezoelectric layer 165 that opposes the IDT electrode 162.

Figure 16D:
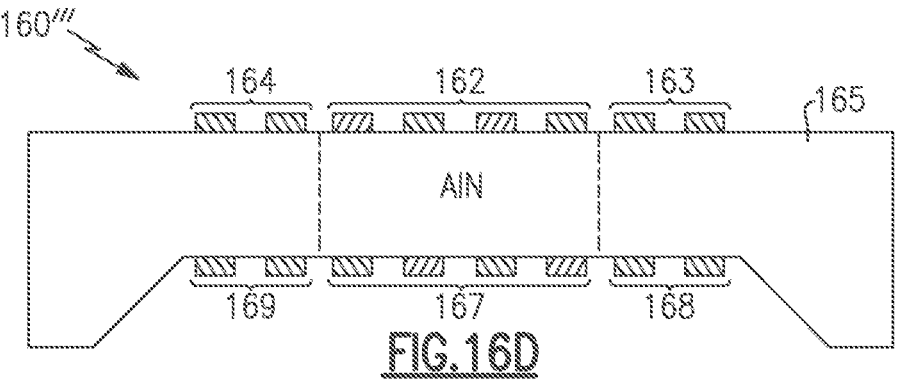

FIG. 16D illustrates a Lamb wave resonator 160''' that includes an IDT electrode 167 and gratings 168 and 169 on a second side of the piezoelectric layer 165 that is opposite to a first side on which the IDT electrode 162 and gratings 163 and 164 are disposed. The signal and ground electrodes are offset relative to each other for the IDT electrodes 162 and 167.

Figure 16E:
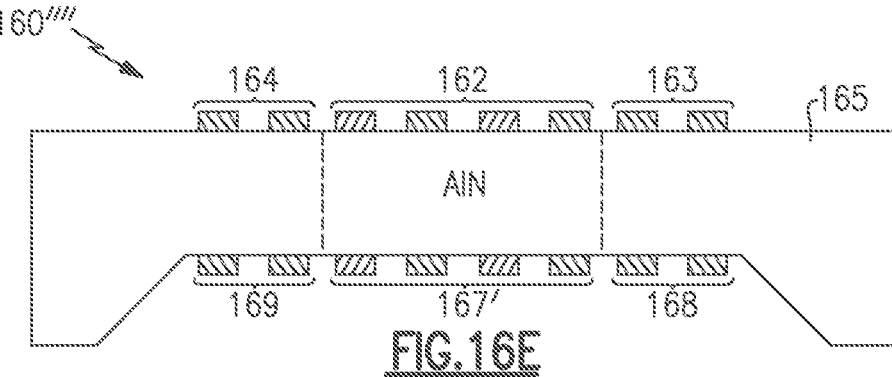

FIG. 16E illustrates a Lamb wave resonator 160"" that includes an IDT electrode 167' and gratings 168 and 169 on a second side of the piezoelectric layer 165 that is opposite to a first side on which the IDT electrode 162 and gratings 163 and 164 are disposed. The signal and ground electrodes are aligned with each other for the IDT electrodes 162 and 167'.

Figure 16F:
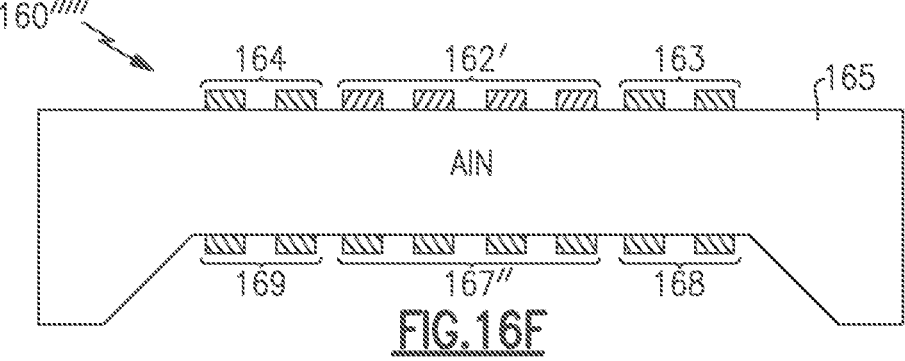

FIG. 16F illustrates a Lamb wave resonator 160""" that includes an IDT electrode 167" and gratings 168 and 169 on a second side of the piezoelectric layer 165 that is opposite to a first side on which the IDT electrode 162' and gratings 163 and 164 are disposed. In the illustrated cross section, the IDT electrode 162' includes only signal electrodes and the IDT electrode 167" includes only ground electrodes.

Lamb wave resonators can include an IDT electrode with free edges. Suspended free edges of a piezoelectric layer can provide acoustic wave reflection to form a resonant cavity in such resonators. FIGS. 17A to 17F are diagrams of cross sections of Lamb wave resonators with free edges. These Lamb wave resonators can be bent resonators in accordance with any suitable principles and advantages discussed herein. For example, a bent acoustic wave resonator can be implemented with any suitable principles and advantages of any of the acoustic wave resonators of FIGS. 17A to 17F. Although the Lamb wave resonators of FIGS. 17A to 17F are free-standing resonators, any suitable principles and advantages of these Lamb wave resonators can be applied to other suitable acoustic wave resonators.

Figure 17A:
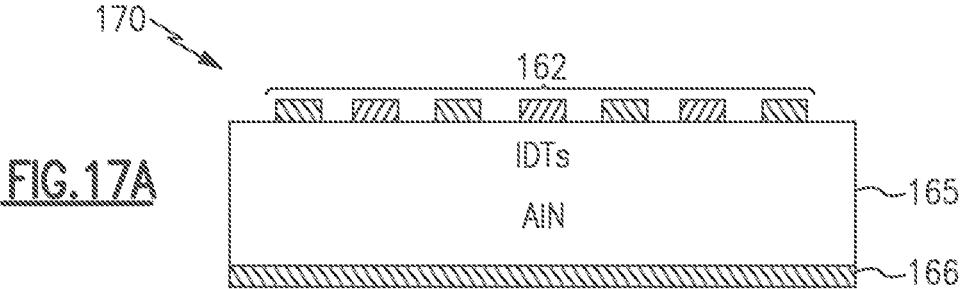
FIGS. 17A to 17F are diagrams of cross sections of Lamb wave resonators with free edges.

FIG. 17A illustrates a Lamb wave resonator 170 that includes IDT electrode 162, piezoelectric layer 165, and electrode 166. The IDT electrode 162 is on the piezoelectric layer 165. In the illustrated cross section, alternate ground and signal electrodes are included in the IDT electrodes. The piezoelectric layer 165 has free edges on opposing sides of the IDT electrode 162. The electrode 166 and the IDT electrode 162 are on opposite sides of the piezoelectric layer 165. The piezoelectric layer 165 can be aluminum nitride, for example. The electrode 166 can be grounded.

Figure 17B:
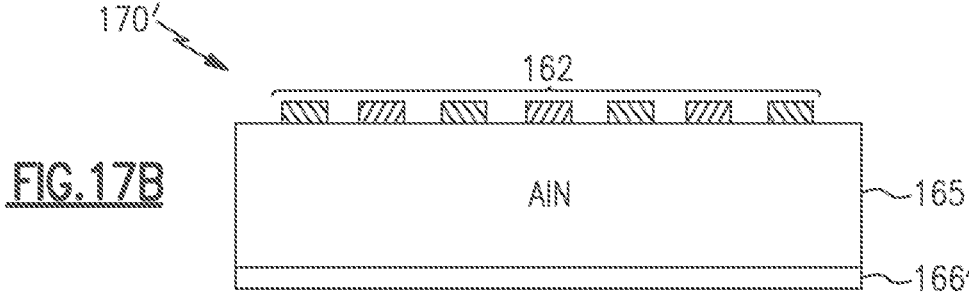

FIG. 17B illustrates a Lamb wave resonator 170'. The Lamb wave resonator 170' is like the Lamb wave resonator 170 of FIG. 17A except that the Lamb wave resonator 170' includes a floating electrode 166'.

Figure 17C:
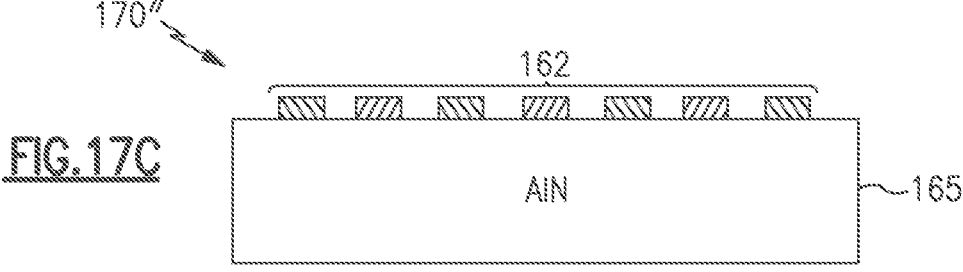

FIG. 17C illustrates a Lamb wave resonator 170" without an electrode on a side of the piezoelectric layer 165 that opposes the IDT electrode 162.

Figures 17D, 17E, 17F:
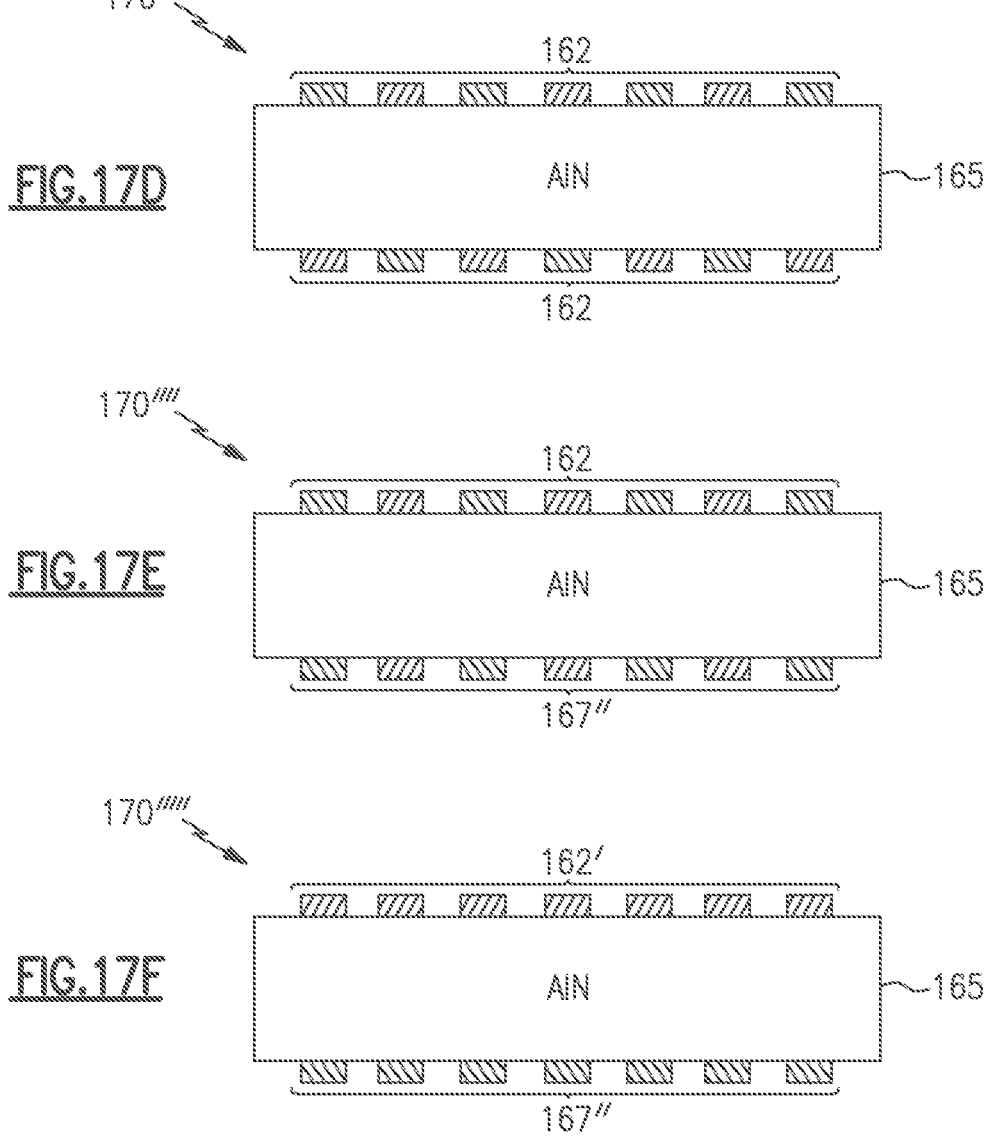

FIG. 17D illustrates a Lamb wave resonator 170''' that includes an IDT electrode 167 on a second side of the piezoelectric layer 165 that is opposite to a first side on which the IDT electrode 162 is disposed. The signal and ground electrodes are offset relative to each other for the IDT electrodes 162 and 167.

FIG. 17E illustrates a Lamb wave resonator 170"" that includes an IDT electrode 167' on a second side of the piezoelectric layer 165 that is opposite to a first side on which the IDT electrode 162 is disposed. The signal and ground electrodes are aligned with each other for the IDT electrodes 162 and 167'.

FIG. 17F illustrates a Lamb wave resonator 170""" that includes an IDT electrode 167" on a second side of the piezoelectric layer 165 that is opposite to a first side on which the IDT electrode 162' is disposed. In the illustrated cross section, the IDT electrode 162' includes only signal electrodes and the IDT electrode 167" includes only ground electrodes.

An acoustic wave device, such as a SAW resonator, including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more bent SAW resonators disclosed herein. FR1 can be from 410 megahertz (MHz) to 7.125 gigahertz (GHz), for example, as specified in a current 5G NR specification. One or more bent acoustic wave resonators in accordance with any suitable principles and advantages disclosed herein can be included in a filter arranged to filter a radio frequency signal in a 4G LTE operating band and/or in a filter having a passband that includes a 4G LTE operating band and a 5G NR operating band.

A method of filtering a radio frequency signal includes providing the radio frequency signal to an acoustic wave filter that includes a bent acoustic wave resonator. The bent acoustic wave resonator can be implemented in accordance with any suitable principles and advantages disclosed herein. The acoustic wave filter can include any suitable number of bent acoustic wave resonators. The method includes filtering the radio frequency signal with the acoustic wave filter. The method also includes during the filtering, suppressing a transverse spurious mode of the bent acoustic wave resonator. The bent acoustic wave resonator includes a bent section arranged to create a curvature in a waveguide of the bent acoustic wave resonator to thereby suppress the transverse spurious mode.

Figures 18, 19:
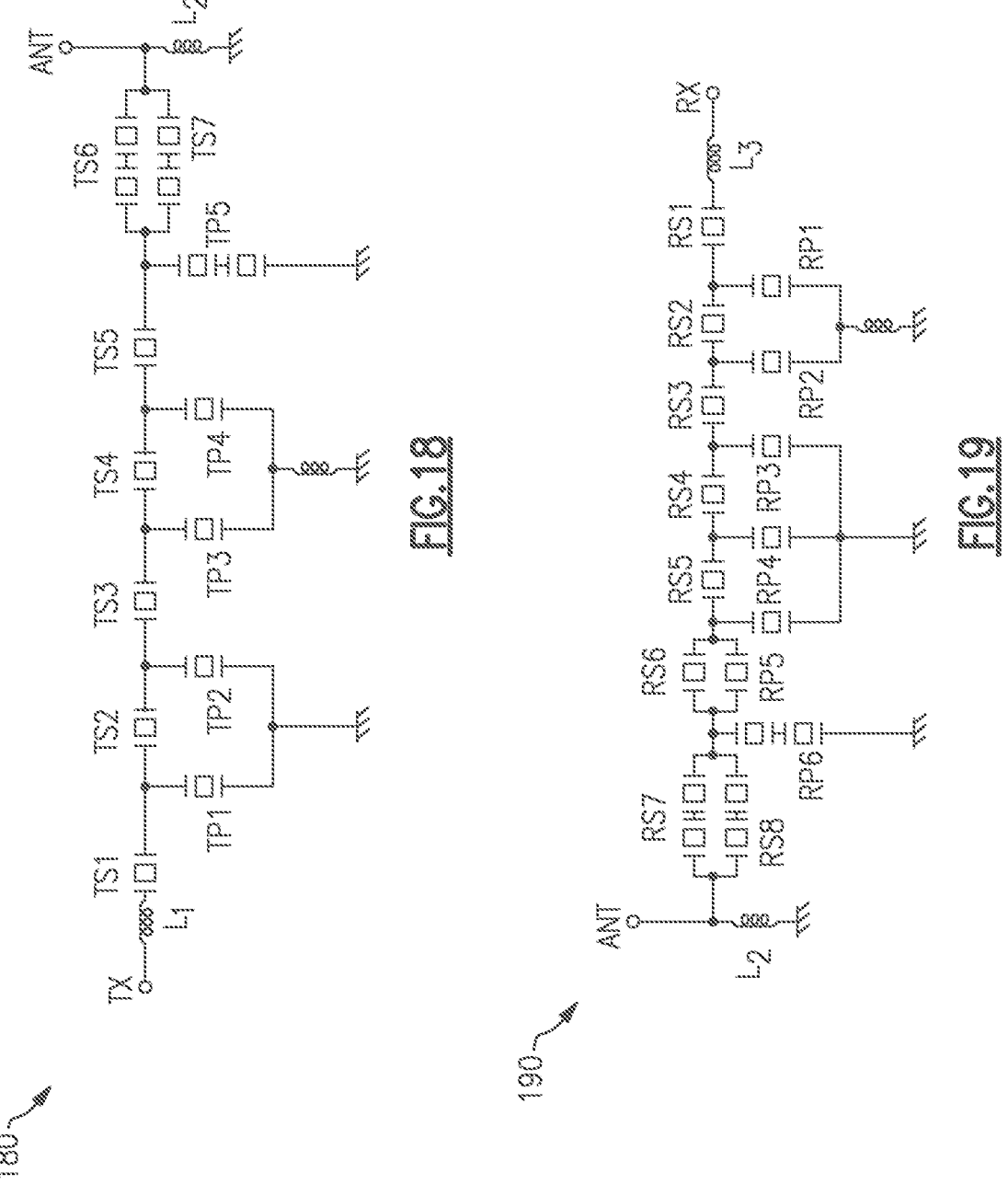
FIG. 18 is a schematic diagram of a transmit filter that includes an acoustic wave resonator according to an embodiment.
FIG. 19 is a schematic diagram of a receive filter that includes an acoustic wave resonator according to an embodiment.

FIG. 18 is a schematic diagram of an example transmit filter 180 that includes acoustic wave resonators according to an embodiment. The transmit filter 180 can be a band pass filter. The illustrated transmit filter 180 is arranged to filter a radio frequency signal received at a transmit port TX and provide a filtered output signal to an antenna port ANT. The transmit filter 180 includes series SAW resonators TS1, TS2, TS3, TS4, TS5, TS6, and TS7, shunt SAW resonators TP1, TP2, TP3, TP4, and TP5, series input inductor L1, and shunt inductor L2. Some or all of the acoustic wave resonators TS1 to TS7 and/or TP1 to TP5 can be bent acoustic wave resonators in accordance with any suitable principles and advantages disclosed herein. Some or all of the acoustic wave resonators TS1 to TS7 and/or TP1 to TP5 can be bent acoustic wave resonators with a piston mode structure in accordance with any suitable principles and advantages disclosed herein. Any suitable number of series acoustic wave resonators and shunt acoustic wave resonators can be included in a transmit filter 180. Such acoustic wave resonators can be TC-SAW resonators in certain applications.

Bent shunt acoustic wave resonators can contribute more to transverse mode suppression than bent series acoustic wave resonators in the transmit filter 180. Accordingly, in a transmit filter in which a subset of the acoustic wave resonators is bent, the bent acoustic wave resonator(s) can be shunt acoustic wave resonator(s). The shunt acoustic wave resonators TP1 and TP5 closest to the input and output ports, respectively, of the transmit filter 180 can have the largest impact on transverse mode suppression. Accordingly, making the acoustic wave resonators TP1 and TP5 bent acoustic wave resonators can have the largest impact on transverse mode suppression in such instances.

FIG. 19 is a schematic diagram of a receive filter 190 that includes acoustic wave resonators according to an embodiment. The receive filter 190 can be a band pass filter. The illustrated receive filter 190 is arranged to filter a radio frequency signal received at an antenna port ANT and provide a filtered output signal to a receive port RX. The receive filter 190 includes series SAW resonators RS1, RS2, RS3, RS4, RS5, RS6, RS7, and RS8, shunt SAW resonators RP1, RP2, RP3, RP4, and RP5, and RP6, shunt inductor L2, and series output inductor L3. Some or all of the acoustic wave resonators RS1 to RS8 and/or RP1 to RP6 can be bent acoustic wave resonators in accordance with any suitable principles and advantages disclosed herein. Some or all of the acoustic wave resonators RS1 to RS8 and/or RP1 to RP6 can be bent acoustic wave resonators with a piston mode structure in accordance with any suitable principles and advantages disclosed herein. Any suitable number of series acoustic wave resonators and shunt acoustic wave resonators can be included in a receive filter 190. Such acoustic wave resonators can be TC-SAW resonators in certain applications.

Bent shunt acoustic wave resonators can contribute more to transverse mode suppression than bent series acoustic wave resonators in the receive filter 190. Accordingly, in a receive filter 190 in which a subset of the acoustic wave resonators is bent, the bent acoustic wave resonator(s) can be shunt acoustic wave resonator(s). The shunt acoustic wave resonators RP6 and RP1 closest to the input and output ports, respectively, of the receive filter 190 can have the largest impact on transverse mode suppression. Accordingly, making the acoustic wave resonators RP1 and RP6 bent acoustic wave resonators can have the largest impact on transverse mode suppression in such instances.

The acoustic wave devices disclosed herein can be implemented in a variety of packaged modules. A module that includes a radio frequency component can be referred to as a radio frequency module. Example radio frequency modules will now be described in which any suitable principles and advantages of the acoustic wave devices disclosed herein can be implemented. A radio frequency module can include one or more features of any of the radio frequency modules of FIG. 20 and/or the radio frequency module of FIG. 21.

Figure 20:
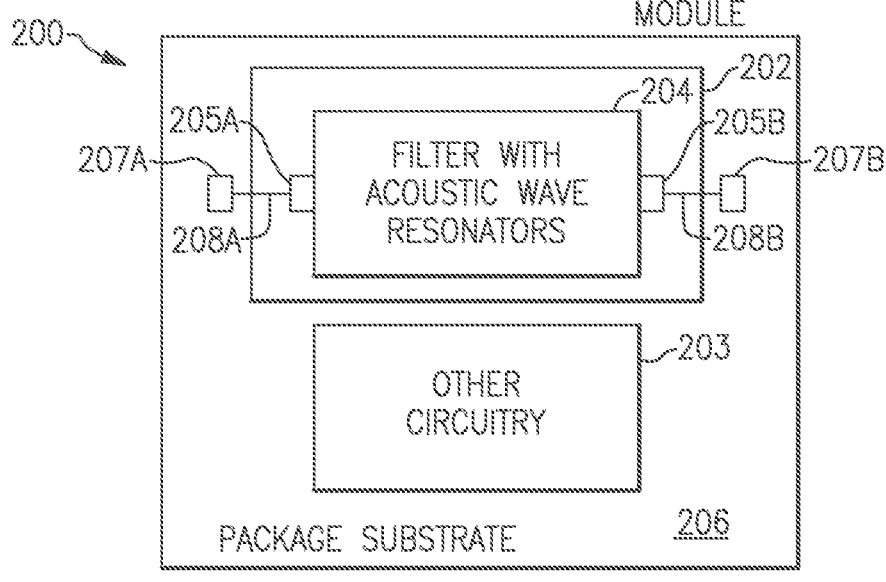
FIG. 20 is a schematic diagram of a radio frequency module that includes an acoustic wave device according to an embodiment.

FIG. 20 is a schematic diagram of a radio frequency module 200 that includes an acoustic wave component 202 according to an embodiment. The illustrated radio frequency module 200 includes the acoustic wave component 202 and other circuitry 203. The acoustic wave component 202 can include one or more bent acoustic wave resonators with any suitable combination of features of the acoustic wave resonators disclosed herein. The acoustic wave component 202 can include an acoustic wave die that includes acoustic wave resonators. For example, the acoustic wave component 202 can include a SAW die that includes SAW resonators.

The acoustic wave component 202 shown in FIG. 20 includes a filter 204 and terminals 205A and 205B. The filter 204 includes acoustic wave resonators. One or more of the acoustic wave resonators can be implemented in accordance with any suitable principles and advantages of the bent acoustic wave resonators disclosed herein. The terminals 205A and 204B can serve, for example, as an input contact and an output contact. The acoustic wave component 202 and the other circuitry 203 are on a common packaging substrate 206 in FIG. 20. The package substrate 206 can be a laminate substrate. The terminals 205A and 205B can be electrically connected to contacts 207A and 207B, respectively, on the packaging substrate 206 by way of electrical connectors 208A and 208B, respectively. The electrical connectors 208A and 208B can be bumps or wire bonds, for example.

The other circuitry 203 can include any suitable additional circuitry. For example, the other circuitry can include one or more one or more power amplifiers, one or more radio frequency switches, one or more additional filters, one or more low noise amplifiers, one or more RF couplers, one or more delay lines, one or more phase shifters, the like, or any suitable combination thereof. The radio frequency module 200 can include one or more packaging structures to, for example, provide protection and/or facilitate easier handling of the radio frequency module 200. Such a packaging structure can include an overmold structure formed over the packaging substrate 206. The overmold structure can encapsulate some or all of the components of the radio frequency module 200.

Figure 21:
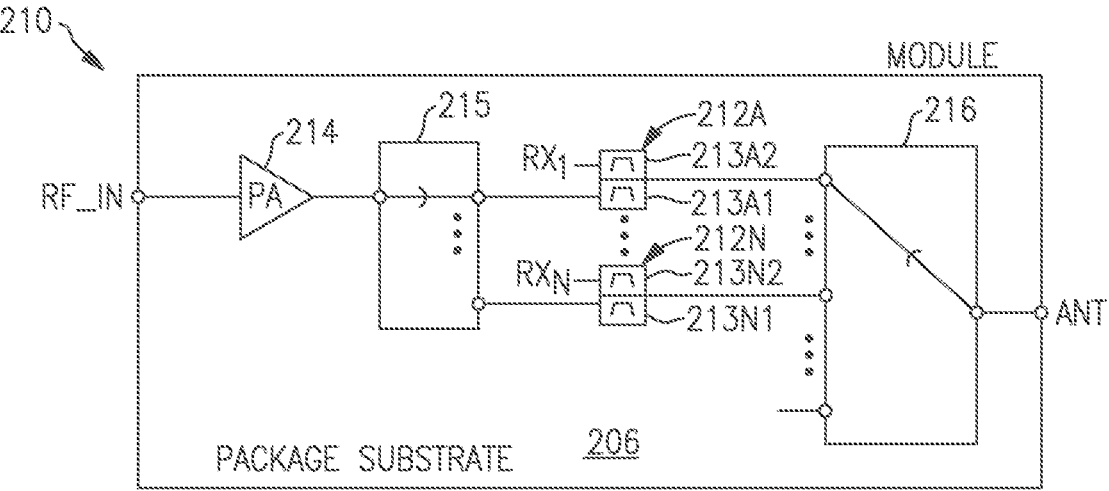
FIG. 21 is a schematic diagram of a radio frequency module that includes an acoustic wave component according to an embodiment.

FIG. 21 is a schematic diagram of a radio frequency module 210 that includes an acoustic wave component according to an embodiment. As illustrated, the radio frequency module 210 includes duplexers 212A to 212N that include respective transmit filters 213A1 to 213N1 and respective receive filters 213A2 to 213N2, a power amplifier 214, a select switch 215, and an antenna switch 216. The radio frequency module 210 can include a package that encloses the illustrated elements. The illustrated elements can be disposed on a common packaging substrate 206. The packaging substrate 206 can be a laminate substrate, for example. A radio frequency module that includes a power amplifier can be referred to as a power amplifier module. A radio frequency module can include a subset of the elements illustrated in FIG. 21 and/or additional elements.

The duplexers 212A to 212N can each include two acoustic wave filters coupled to a common node. The two acoustic wave filters can be a transmit filter and a receive filter. As illustrated, the transmit filter and the receive filter can each be a band pass filter arranged to filter a radio frequency signal. One or more of the transmit filters 213A1 to 213N1 can include one or more bent acoustic wave resonators in accordance with any suitable principles and advantages disclosed herein. Similarly, one or more of the receive filters 213A2 to 213N2 can include one or more acoustic wave resonators in accordance with any suitable principles and advantages disclosed herein. Although FIG. 21 illustrates duplexers, any suitable principles and advantages disclosed herein can be implemented in other multiplexers (e.g., quadplexers, hexaplexers, octoplexers, etc.) and/or in switch-plexers.

The power amplifier 214 can amplify a radio frequency signal. The illustrated switch 215 is a multi-throw radio frequency switch. The switch 215 can electrically couple an output of the power amplifier 214 to a selected transmit filter of the transmit filters 213A1 to 213N1. In some instances, the switch 215 can electrically connect the output of the power amplifier 214 to more than one of the transmit filters 213A1 to 213N1. The antenna switch 216 can selectively couple a signal from one or more of the duplexers 212A to 212N to an antenna port ANT. The duplexers 212A to 212N can be associated with different frequency bands and/or different modes of operation (e.g., different power modes, different signaling modes, etc.).

Figure 22A:
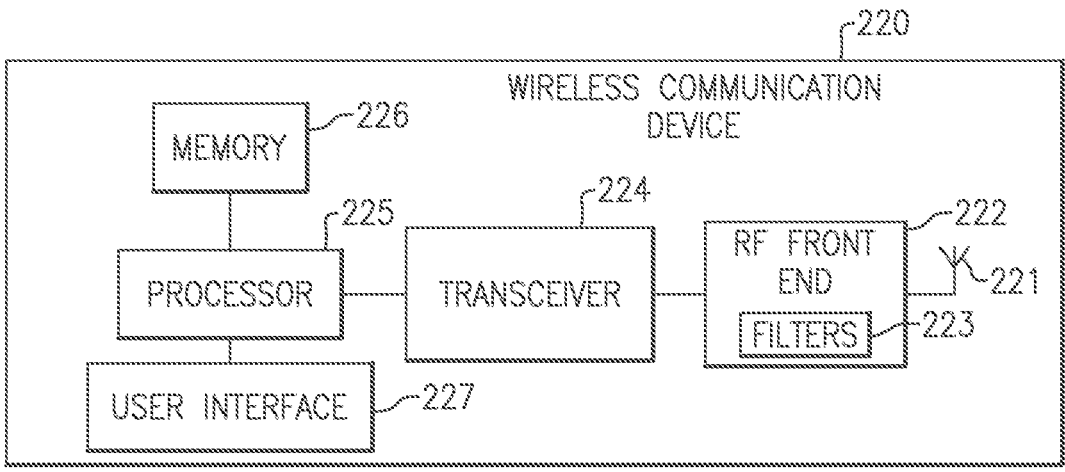
FIG. 22A is a schematic block diagram of a wireless communication device that includes a filter in accordance with one or more embodiments.

FIG. 22A is a schematic diagram of a wireless communication 220 device that includes filters 223 in a radio frequency front end 222 according to an embodiment. The filters 223 can include one or more bent acoustic wave resonators in accordance with any suitable principles and advantages discussed herein. The wireless communication device 220 can be any suitable wireless communication device. For instance, a wireless communication device 220 can be a mobile phone, such as a smart phone. As illustrated, the wireless communication device 220 includes an antenna 221, an RF front end 222, a transceiver 224, a processor 225, a memory 226, and a user interface 227. The antenna 221 can transmit RF signals provided by the RF front end 222. Such RF signals can include carrier aggregation signals. The antenna 221 can receive RF signals and provide the received RF signals to the RF front end 222 for processing.

The RF front end 222 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 222 can transmit and receive RF signals associated with any suitable communication standards. The filters 223 can include one or more bent acoustic wave resonators that include any suitable combination of features discussed with reference to any embodiments discussed above.

The transceiver 224 can provide RF signals to the RF front end 222 for amplification and/or other processing. The transceiver 224 can also process an RF signal provided by a low noise amplifier of the RF front end 222. The transceiver 224 is in communication with the processor 225. The processor 225 can be a baseband processor. The processor 225 can provide any suitable base band processing functions for the wireless communication device 220. The memory 226 can be accessed by the processor 225. The memory 226 can store any suitable data for the wireless communication device 220. The user interface 227 can be any suitable user interface, such as a display with touch screen capabilities.

Figure 22B:
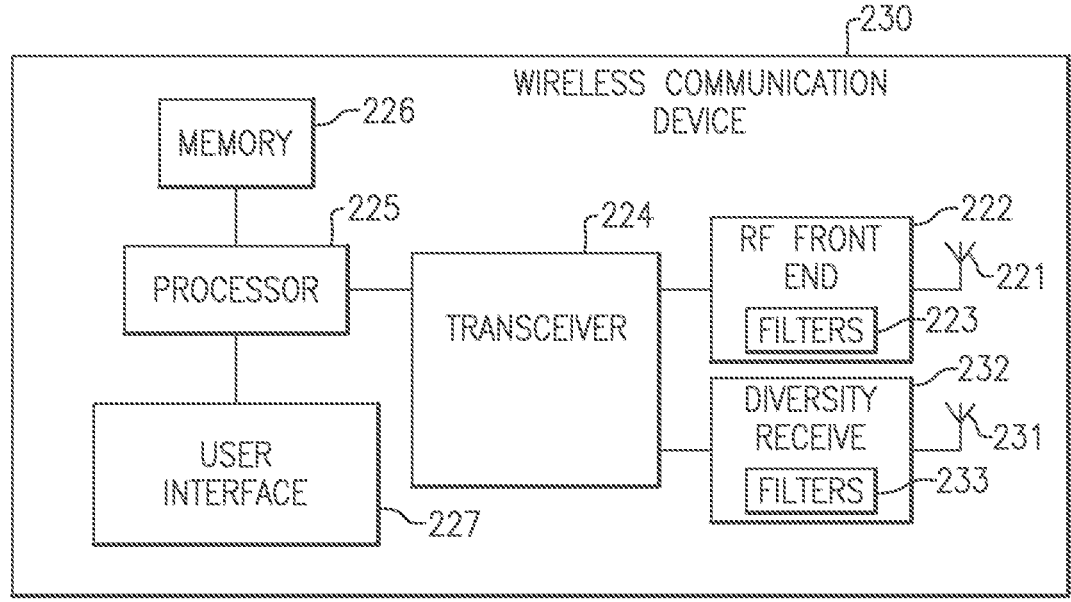
FIG. 22B is a schematic block diagram of another wireless communication device that includes a filter in accordance with one or more embodiments.

FIG. 22B is a schematic diagram of a wireless communication device 230 that includes filters 223 in a radio frequency front end 222 and second filters 233 in a diversity receive module 232. The wireless communication device 230 is like the wireless communication device 220 of FIG. 22A, except that the wireless communication device 230 also includes diversity receive features. As illustrated in FIG. 22B, the wireless communication device 230 includes a diversity antenna 231, a diversity module 232 configured to process signals received by the diversity antenna 231 and including filters 233, and a transceiver 234 in communication with both the radio frequency front end 222 and the diversity receive module 232. The filters 233 can include one or more bent acoustic wave resonators that include any suitable combination of features discussed with reference to any embodiments discussed above.

Although embodiments are discussed with reference to certain acoustic wave resonators, any suitable principles and advantages disclosed herein can be applied to any other suitable acoustic wave resonators, such as boundary acoustic wave resonators.

Any of the embodiments described above can be implemented in mobile devices such as cellular handsets. The principles and advantages of the embodiments can be used for any systems or apparatus, such as any uplink cellular device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals having a frequency in a range from about 30 kHz to 300 GHz, such as a frequency in a range from about 450 MHz to 8.5 GHZ.

Aspects of this disclosure can be implemented in various electronic devices. Examples of the electronic devices can include, but are not limited to, consumer electronic products, parts of the consumer electronic products such as die and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an car piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device having an acoustic aperture, the acoustic wave device comprising:
   a piezoelectric layer; and
   an interdigital transducer electrode on the piezoelectric layer, the interdigital transducer electrode including a bent section arranged to create a curvature in the acoustic aperture, the interdigital transducer electrode including a first bus bar and a second bus bar having substantially the same shape and orientation as each other in the bent section, and the first bus bar being curved in the bent section.

2. The acoustic wave device of claim 1 wherein the interdigital transducer electrode includes inner fingers in the bent section positioned between two outer fingers in the bent section, and the bent section has a bend angle between intersecting lines extends from outer edges of the two outer fingers, and each of the inner fingers and two outer fingers extends from either the first bus bar or the second bus bar.

3. The acoustic wave device of claim 2 wherein the bend angle is in a range from 1° to 20°.

4. The acoustic wave device of claim 2 wherein the bend angle is in a range from 10° to 20°.

5. The acoustic wave device of claim 1 wherein the first bus bar is spaced apart from the second bus bar by substantially the same distance throughout the bent section.

6. The acoustic wave device of claim 1 wherein the interdigital transducer electrode consists essentially of the bent section.

7. The acoustic wave device of claim 1 wherein the acoustic aperture has substantially the same width throughout the bent section.

8. The acoustic wave device of claim 1 wherein the interdigital transducer electrode includes first fingers extending from the first bus bar and second fingers extending from the second bus bar, and all of the first fingers and the second fingers have substantially the same length throughout the bent section.

9. The acoustic wave device of claim 1 wherein the interdigital transducer electrode includes a piston mode structure.

10. The acoustic wave device of claim 1 further comprising a temperature compensation layer over the interdigital transducer electrode.

11. The acoustic wave device of claim 1 further comprising a carrier substrate, the piezoelectric layer positioned over the carrier substrate.

12. A radio frequency module comprising:
    a filter configured to filter a radio frequency signal, the filter including an acoustic wave resonator having an acoustic aperture, the acoustic wave resonator including a piezoelectric layer and an interdigital transducer electrode on the piezoelectric layer, the interdigital transducer electrode including a bent section arranged to create a curvature in the acoustic aperture, the interdigital transducer electrode including a first bus bar and a second bus bar having substantially the same shape and orientation as each other in the bent section, and the first bus bar being curved in the bent section; and
    a radio frequency switch coupled to the filter.

13. The radio frequency module of claim 12 wherein the bent section has a bend angle between in a range from 1° to 20°.

14. The radio frequency module of claim 13 wherein the bend angle is in a range from 10° to 20°.

15. The radio frequency module of claim 12 further comprising a power amplifier configured to output the radio frequency signal.

16. The radio frequency module of claim 12 wherein the interdigital transducer electrode includes inner fingers in the bent section positioned between two outer fingers in the bent section, and all of the inner fingers have substantially the same length throughout the bent section.

17. The radio frequency module of claim 12 wherein the interdigital transducer electrode includes a piston mode structure.

18. The radio frequency module of claim 12 further comprising a temperature compensation layer over the interdigital transducer electrode.

19. The radio frequency module of claim 12 further comprising a carrier substrate, the piezoelectric layer positioned over the carrier substrate.

* * * * *